United States Patent
Ogihara et al.

(10) Patent No.: US 6,384,429 B1
(45) Date of Patent: May 7, 2002

(54) LIGHT-EMITTING SEMICONDUCTOR DEVICE WITH REDUCED OBSTRUCTIONS TO LIGHT EMISSION

(75) Inventors: Mitsuhiko Ogihara; Yukio Nakamura; Masumi Taninaka; Hiroshi Hamano, all of Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 09/348,562

(22) Filed: Jul. 7, 1999

(30) Foreign Application Priority Data

Jul. 9, 1998 (JP) .......... 10-193914

(51) Int. Cl.[7] .......... H01L 33/00
(52) U.S. Cl. .......... 257/88; 257/79; 257/80; 257/81; 257/82; 257/83; 257/84; 257/101
(58) Field of Search .......... 257/79, 83, 101, 257/80, 81, 82, 84, 88

(56) References Cited

U.S. PATENT DOCUMENTS

| | | | | |
|---|---|---|---|---|
| 4,680,768 A | * | 7/1987 | Yagi | 372/45 |
| 4,731,789 A | * | 3/1988 | Thornton | 372/45 |
| 5,189,496 A | * | 2/1993 | Kuwabara | 257/79 |
| 5,212,705 A | * | 5/1993 | Kahen et al. | 372/46 |
| 5,219,785 A | * | 6/1993 | Welch et al. | 437/129 |
| 5,291,507 A | * | 3/1994 | Haase et al. | 372/44 |

OTHER PUBLICATIONS

"Hikari Purinta no Sekkei" (Photo Printer Design), ed. Yoshihiro Takekida, Trikeppusu KK., Oct. 31, 1985 pp. 121–126.

U.S. Patent Application No. 09/093,609 filed Jun. 9, 1998.

* cited by examiner

Primary Examiner—Eddie Lee
Assistant Examiner—Eugene Lee
(74) Attorney, Agent, or Firm—Venable; Michael A. Sartori; Jeffrey W. Gluck

(57) ABSTRACT

In one aspect of the invention, a light-emitting semiconductor device has a light-emitting layer with a certain bandgap energy, an upper cladding layer with a higher bandgap energy, a first diffusion area extending into the light-emitting layer, a second diffusion area extending only into the upper cladding layer, and an electrode making contact with the second diffusion area, without covering any part of the first diffusion area. The second diffusion area conducts current to the first diffusion area, where light is emitted from a pn junction in the light-emitting layer. In another aspect of the invention, a semiconductor contact layer is provided to assure ohmic contact with the electrode, and the semiconductor contact layer is removed from the light-emitting area, avoiding absorption of light.

32 Claims, 34 Drawing Sheets

FIG.22
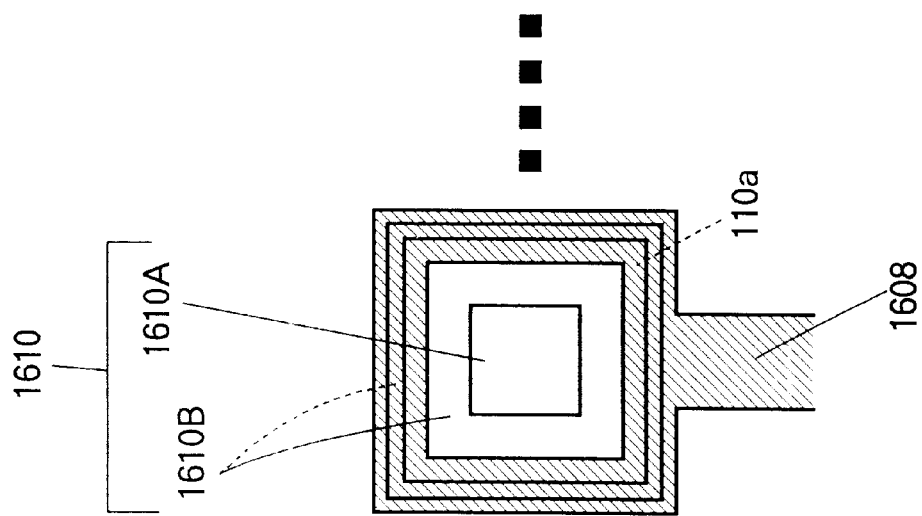
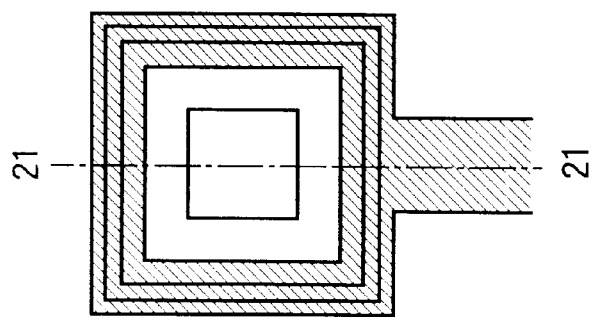
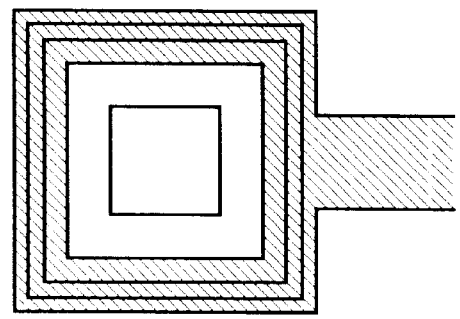

LIGHT-EMITTING SEMICONDUCTOR DEVICE WITH REDUCED OBSTRUCTIONS TO LIGHT EMISSION

BACKGROUND OF THE INVENTION

The present invention relates to a light-emitting semiconductor device, such as a light-emitting diode, having a pn junction.

One conventional type of light-emitting diode (LED) is formed on the semiconductor substrate 30 shown in FIG. 34, comprising an n-type gallium-arsenide (GaAs) substrate layer 31 and an n-type gallium-arsenide-phosphide (GaAsP) epitaxial layer 32. Zinc (Zn) is selectively diffused into the epitaxial layer 32 to create a p-type diffusion area 33. The device is covered with an inter-layer insulating film 34, leaving a window through which a p-electrode 35 makes contact with the p-type diffusion area 33. An n-electrode 36 is formed on the underside of the device, in contact with the GaAs substrate layer 31. When a forward voltage is applied between the p-electrode 35 and n-electrode 36, light is emitted by recombination of carriers in the vicinity of the pn junction between the p-type diffusion area 33 and n-type epitaxial layer 32. In some LEDs, an additional semiconductor contact layer is formed as the uppermost layer of the substrate 30, to ensure ohmic contact between the p-electrode 35 and p-type diffusion area 33.

A problem in this conventional LED is that the p-electrode 35 blocks part of the emitted light. When the dimensions of the p-type diffusion area 33 are very small, the p-type electrode 35 may block most of the light. The problem is aggravated if the sheet resistance of the p-type diffusion area 33 is low, because then most of the driving current flows straight downward, and most of the light is emitted directly below the p-type electrode 35. Attempts to solve this problem by reducing the relative size of the p-electrode 35 have failed, because when the area of contact between the p-electrode 35 and p-type diffusion area 33 is reduced, the contact resistance is increased, and if the contact area is too small, the p-type electrode cannot supply enough current to drive the device at the small driving voltages typical of integrated driving circuits.

This problem occurs in LED arrays used as light sources in high-resolution printers, such as printers printing one thousand two hundred dots per inch (1200 dpi), for example. A further problem in such arrays is that variations in the contact area from one LED to another in the array create differences in driving current, leading to non-uniform light emission and undesirable printing irregularities.

If the substrate 30 has an uppermost semiconductor contact layer to assure ohmic contact, another problem occurs: the semiconductor contact layer absorbs light, reducing the emission efficiency of the device.

SUMMARY OF THE INVENTION

It is accordingly an object of the present invention to increase the light-emitting efficiency of a light-emitting semiconductor device.

According to a first aspect of the invention, a light-emitting semiconductor device comprises a semiconductor substrate having a plurality of semiconductor layers of a first conductive type, these layers including at least a light-emitting layer with a first bandgap energy, and an upper cladding layer, disposed above the light-emitting layer, with a second bandgap energy exceeding the first bandgap energy. A first diffusion area is formed by diffusion of an impurity of a second conductive type from the upper surface of the semiconductor substrate into the upper cladding layer and the light-emitting layer. A second diffusion area, continuous with the first diffusion area, is formed by diffusion of the same impurity from the upper surface into the upper cladding layer, but not into the light-emitting layer. A first electrode makes contact with a portion of the substrate outside the first and second diffusion areas. A second electrode, disposed outside the first diffusion area, makes contact with the upper surface of the substrate in the second diffusion area.

In the first aspect of the invention, light is emitted from the surface of the first diffusion area. The light is not blocked by the second electrode, and both the light-emitting area and the area of contact between the second diffusion area and second electrode can be adequately large.

According to a second aspect of the invention, a light-emitting semiconductor device comprises a semiconductor substrate having an upper surface, a semiconductor contact layer disposed at the upper surface, and a plurality of semiconductor layers of a first conductive type disposed below the upper surface. The layers of the first conductive type include at least a light-emitting layer with a first bandgap energy, and an upper cladding layer, disposed above the light-emitting layer, with a second bandgap energy exceeding the first bandgap energy. A diffusion area is formed by diffusion of an impurity of a second conductive type from the upper surface into the semiconductor contact layer, the upper cladding layer, and the light-emitting layer. One part of the diffusion area is a contact area. The portion of the semiconductor contact layer disposed in the diffusion area exterior to the contact area is removed by etching. A first electrode makes contact with the semiconductor substrate in an area outside the diffusion area. A second electrode makes ohmic contact with the contact area.

In the second aspect of the invention, light is emitted from an area including the part of the diffusion area not covered by the second electrode. Light emission is enhanced by removal of the semiconductor contact layer in this area.

The two aspects can be combined by providing a semiconductor contact layer in the first aspect of the invention, the semiconductor contact layer being completely removed by etching from the first diffusion area.

BRIEF DESCRIPTION OF THE DRAWINGS

In the attached drawings:

FIG. 22 is a plan view of the sixth embodiment;

DETAILED DESCRIPTION OF THE INVENTION

Figure 1:
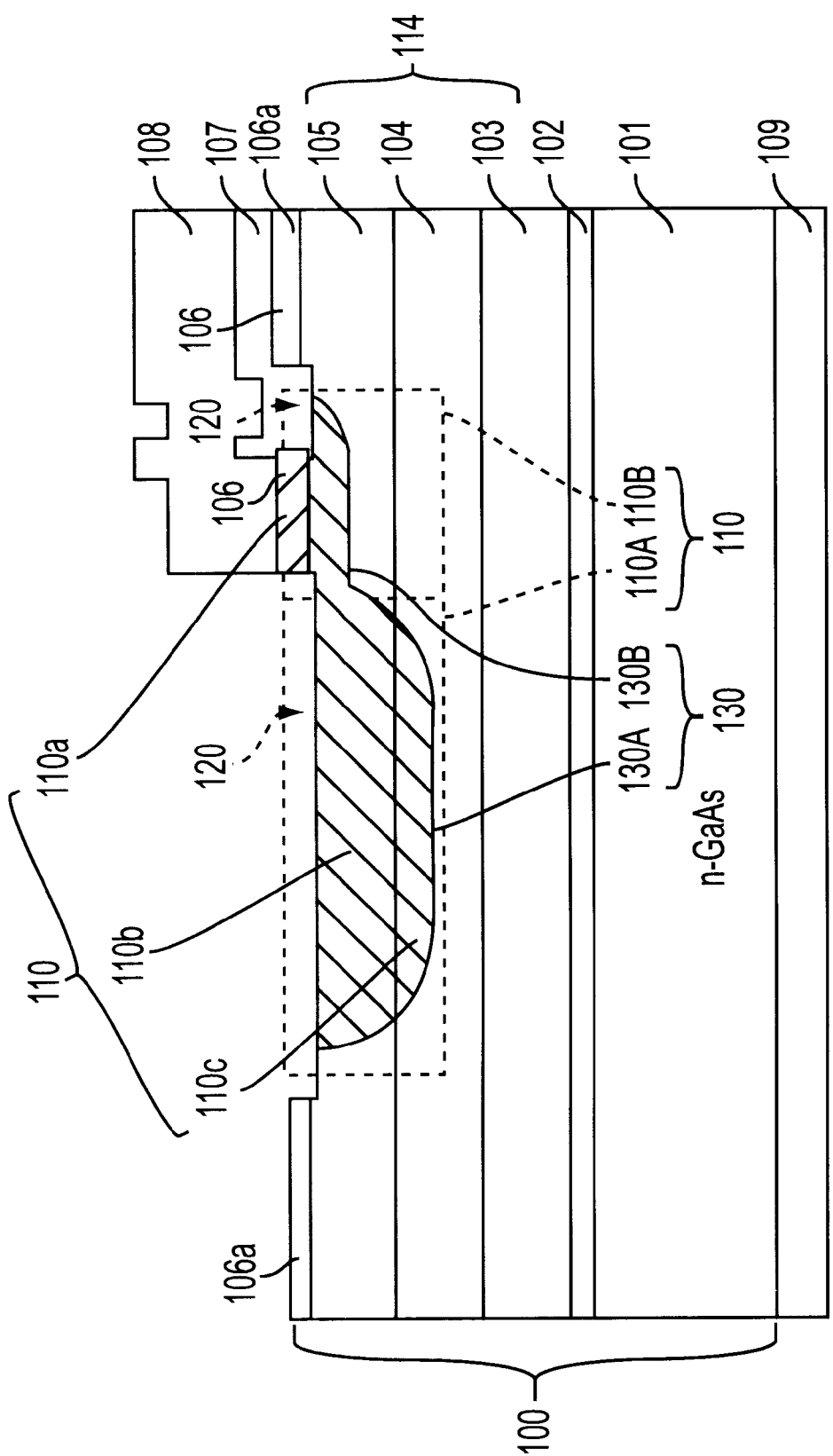
FIG. 1 is a sectional view of a first embodiment, illustrating the first aspect of the invention.

Embodiments of the invention will be described with reference to the attached drawings, in which like parts are indicated by like reference characters. The embodiments are LED arrays comprising a plurality of LEDs.

Referring to FIG. 1, an LED in the first embodiment of the invention is formed in a semiconductor substrate 100 comprising, from bottom to top, an n-type GaAs substrate layer 101, an n-type GaAs buffer layer 102, an n-type aluminum-gallium-arsenide ($Al_zGa_{1-z}As$) layer 103, an n-type $Al_yGa_{1-y}As$ layer 104, an n-type $Al_xGa_{1-x}As$ layer 105, and a semi-insulating GaAs contact layer 106. The upper layers 102, 103, 104, 105, 106 are grown epitaxially on the substrate layer 101. The semi-insulating GaAs contact layer 106 is a thin layer, being only five hundred angstroms (500 Å) thick, for example. The aluminum composition ratios x, y, z of layers 105, 104, 103 satisfy the following relations:

$1 \geq x > y \geq 0$ $1 \geq z > y \geq 0$

The bandgap energy Eg(103) of the $Al_zGa_{1-z}As$ layer 103, the bandgap energy Eg(104) of the $Al_yGa_{1-y}As$ layer 104, and the bandgap energy Eg(105) of the $Al_xGa_{1-x}As$ layer 105 accordingly satisfy the following conditions.

Eg(103)>Eg(104)

Eg(105)>Eg(104)

In the first embodiment, appropriate values of x and z are 0.4, with y being equal to 0.15. With these values, Eg(103) and Eg(105) exceed Eg(104) by substantially three-tenths of an electron volt (0.3 eV). This bandgap energy differential is desirable for confining injected carriers in the $Al_yGa_{1-y}As$ layer 104, as described later.

The semi-insulating GaAs contact layer 106 has a resistivity of at least $10^7 \Omega \cdot cm$. This layer 106 may be an intrinsic semiconductor layer or a non-doped layer. A non-doped layer is not necessarily intrinsic, but may be an n-type or p-type layer with a very low carrier concentration.

The device is partly covered by an inter-layer insulating film 107 such as a film of silicon nitride (SiN). A p-electrode 108 is formed on the upper surface of the device, and an n-electrode 109 on the lower surface. The p-electrode 108 is formed by depositing and patterning, for example, an aluminum film or a film comprising gold. The n-electrode 109 is formed by depositing, for example, a gold alloy film.

A p-type diffusion area 110 is formed by selective solid-phase or vapor-phase diffusion of zinc, which is a p-type impurity, into the semiconductor substrate 100. The diffusion extends through the semi-insulating GaAs contact layer 106 and partly into the n-type AlGaAs layers 114. After the p-type diffusion area 110 is formed, the surface of the semiconductor substrate 100 is selectively etched in an etched zone 120, removing the GaAs contact layer 106 from part of the p-type diffusion area 110, removing the interface between the parts of the GaAs contact layer 106 disposed inside and outside the p-type diffusion area 110, and removing part of the $Al_xGa_{1-x}As$ layer 105. Either dry etching or wet etching may be employed.

The diffusion is controlled to form a stepped diffusion front 130. The p-type diffusion area 110 thus comprises a first diffusion area 110A with a first diffusion front 130A extending into the $Al_yGa_{1-y}As$ layer 104, and a second diffusion area 110B that is continuous with the first diffusion area 110A, but has a second diffusion front 130B that extends only into the $Al_xGa_{1-x}As$ layer 105. During the diffusion process, the surface of the semiconductor substrate 100 is covered by a diffusion mask exposing the part that will become the p-type diffusion area 110, and the part that will become the second diffusion area 100B is covered by an additional diffusion control film, causing the second diffusion front 130B to be more shallow than the first diffusion front 130A.

Due to the diffusion, part of the GaAs contact layer 106 becomes a p-type GaAs region 110a, while the rest remains a semi-insulating GaAs layer 106a. Similarly, part of the n-type $Al_xGa_{1-x}As$ layer 105 becomes a p-type $Al_xGa_{1-x}As$ region 110b, and part of the n-type $Al_yGa_{1-y}As$ layer 104 becomes a p-type $Al_yGa_{1-y}As$ region 110c, with pn junctions formed at the diffusion front 130 in the $Al_yGa_{1-y}As$ layer 104 and $Al_xGa_{1-x}As$ layer 105. No pn junction is left in the GaAs contact layer 106, because the part of the GaAs contact layer 106 including the lateral part of the diffusion front 130, where any pn junction might have been formed, is disposed in the etched zone 120. The GaAs contact layer 106 is also entirely removed from the first diffusion area 110A. The first diffusion area 110A comprises only the p-type $Al_yGa_{1-y}As$ region 110c and part of the p-type $Al_xGa_{1-x}As$ region 110b. The second diffusion area 110B comprises the remainder of the p-type $Al_xGa_{1-x}As$ region 110b and the p-type GaAs region 110a.

The p-type GaAs region 110a is left standing as an island inside the etched zone 120, and is thus physically separated by a gap on all sides from the semi-insulating GaAs layer 106a. Part of this gap is filled in by the interlayer insulating film 107, which covers at least those parts of the etched zone 120 and semi-insulating GaAs layer 106a that are disposed below the p-electrode 108. The inter-layer insulating film 107 prevents a short circuit from being formed between the p-electrode 108 and the n-type $Al_xGa_{1-x}As$ layer 105. The p-electrode 108 makes contact with the p-type GaAs region 110a in the second diffusion area 110B, but does not make contact with any part of the first diffusion area 110A.

The function of the GaAs contact layer 106 is to create an ohmic contact with the p-electrode 108. The contact between the p-electrode 108 and the p-type GaAs region 110a is ohmic because the GaAs contact layer 106 contains no aluminum which might be oxidized before deposition of the p-type electrode 108.

Figure 2:
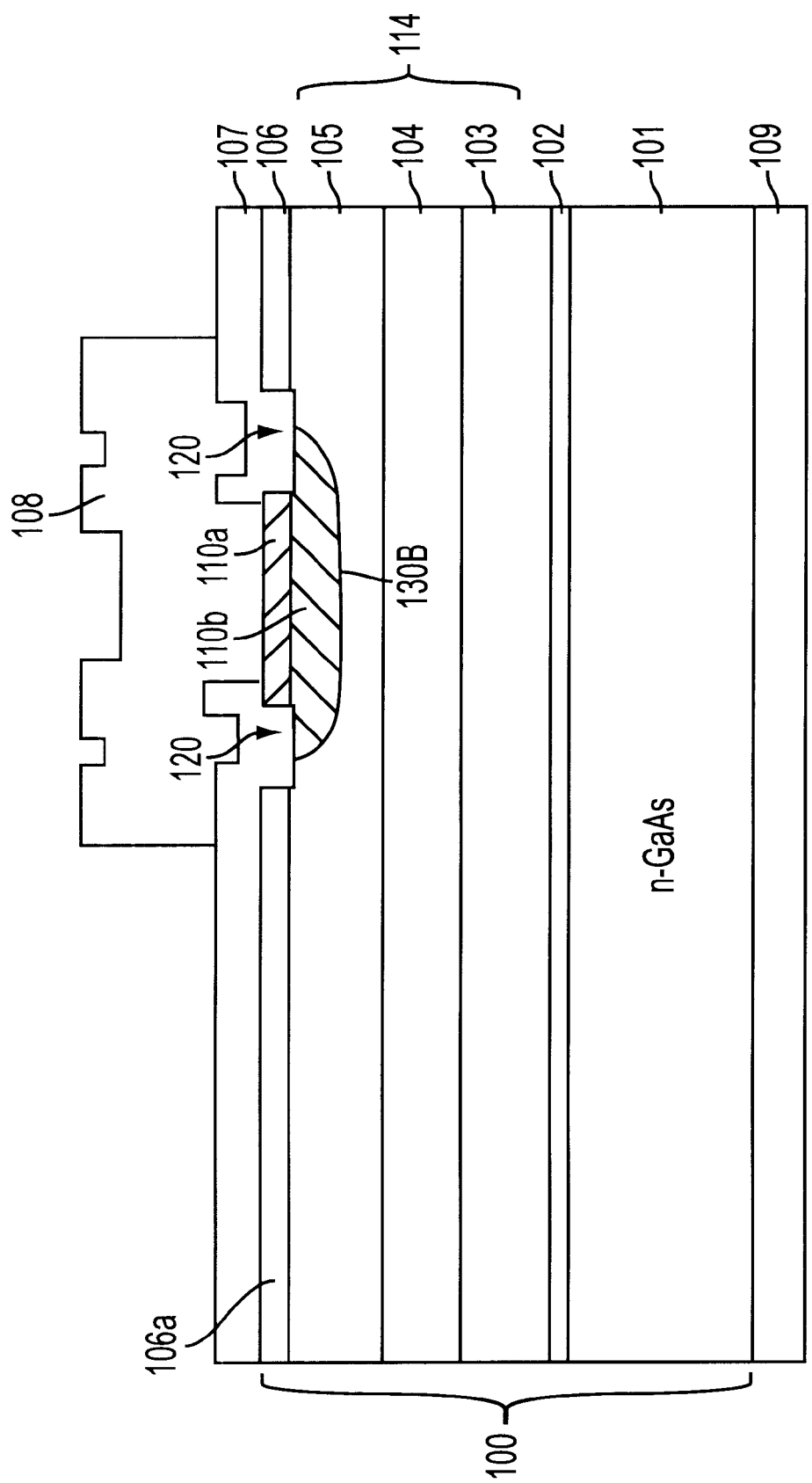
FIG. 2 is another sectional view of the first embodiment.
Figure 3:
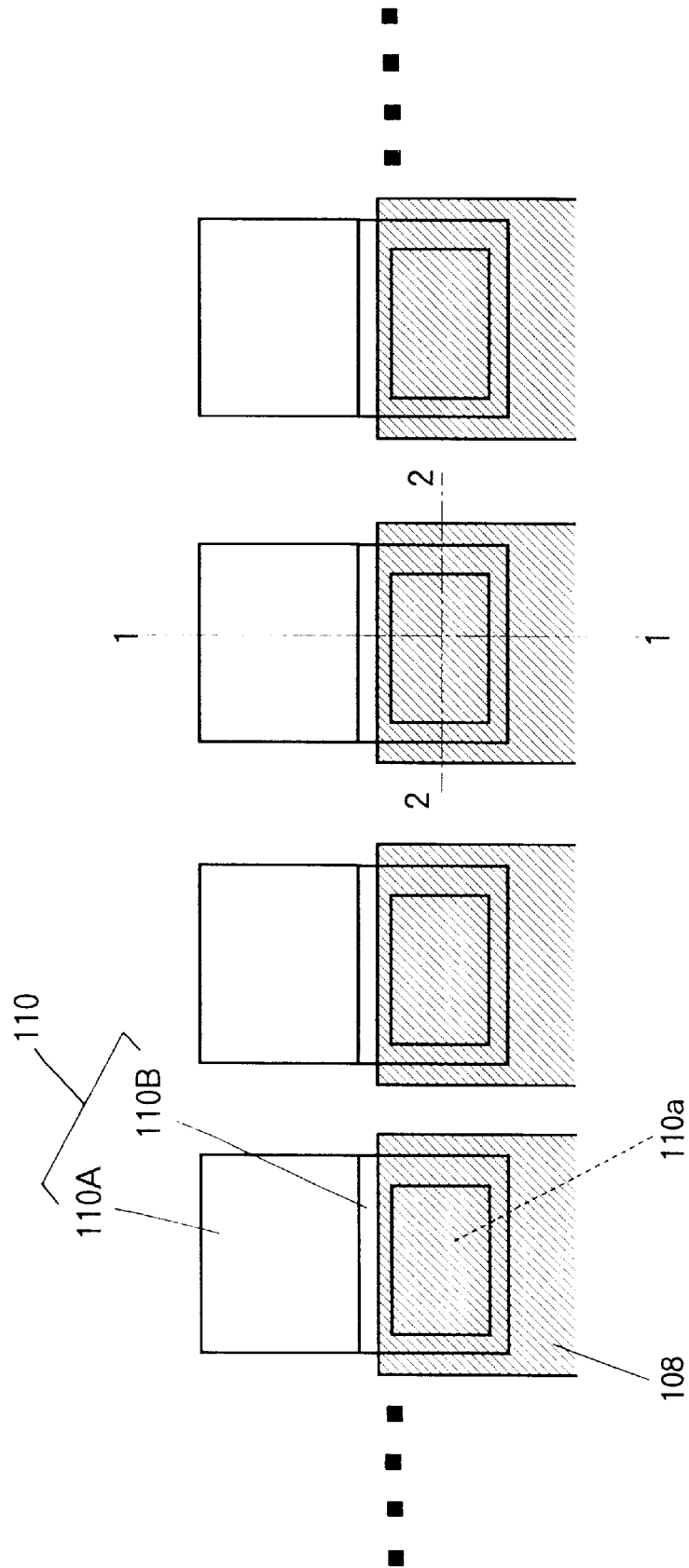
FIG. 3 is a plan view of the first embodiment.

The p-electrode 108, the p-type diffusion area 110, the n-type layers (including the n-type GaAs substrate layer 101, the n-type GaAs buffer layer 102, and the n-type AlGaAs layers 114), and the n-electrode 109 shown in FIG. 1 constitute one LED. FIG. 2 shows a sectional view of this LED at a right angle to the view in FIG. 1. FIG. 3 shows a plan view of part of the first embodiment, indicating the locations of these sectional views (FIG. 1 is a section through line 1—1; FIG. 2 is a section through line 2—2). As FIG. 3 indicates, the first embodiment is a linear LED array, comprising a separate p-electrode 108 and p-type diffusion area 110 for each LED in the array. All of the LEDs are formed in the same semiconductor substrate 100, and share the same n-electrode 109.

Next, the operation of the first embodiment will be described.

When a forward voltage is applied between one of the p-electrodes 108 and the n-electrode 109, current flows from the p-electrode 108 through the p-type diffusion area 110, across the pn junction at the diffusion front 130, and through the n-type layers to the n-electrode 109. As part of the current flow, minority carriers are injected across the pn junction, primarily at the pn junction disposed in the $Al_yGa_{1-y}As$ layer 104, because the bandgap energy of this layer 104 is lower than the bandgap energy of the $Al_xGa_{1-x}As$ layer 105. Thus electrons are injected from the n-type $Al_yGa_{1-y}As$ layer 104 into the p-type $Al_yGa_{1-y}As$ region 110c, where they recombine with holes, and holes are injected from the p-type $Al_yGa_{1-y}As$ region 110c into the n-type $Al_yGa_{1-y}As$ layer 104 where they recombine with electrons. The electron-hole recombination process generates photons of light having an energy, thus a wavelength, corresponding to the bandgap energy of the $Al_yGa_{1-y}As$ layer 104. The bandgap energy is determined mainly by the value of the aluminum composition ratio y, so light of a desired wavelength can be obtained by choosing a corresponding value of y. Light traveling in all directions is generated; the light traveling upward reaches the surface of the first diffusion area 110A, or the surrounding part of the $Al_xGa_{1-x}As$ layer 105, and is emitted to the outside.

As described above, the first diffusion area 110A is the main light-emitting area, and the $Al_yGa_{1-y}As$ layer 104 is the light-emitting layer. The second diffusion area 110B mainly carries current from the p-electrode 108 to the first diffusion area 110A. Little current crosses the pn junction in the second diffusion area 110B, which accordingly emits little light. The $Al_zGa_{1-z}As$ layer 103 and $Al_xGa_{1-x}As$ layer 105 are cladding layers, confining minority carriers injected across the pn-junction so that they remain in the $Al_yGa_{1-y}As$ layer 104, leading to a higher rate of radiative recombination. The carriers are confined by an energy barrier due to the 0.3-eV difference in bandgap energies between the light-emitting layer 104 and the cladding layers 103, 105; electrons injected into the p-type $Al_yGa_{1-y}As$ region 110c do not diffuse into the p-type $Al_xGa_{1-x}As$ region 110b, because the $Al_xGa_{1-x}As$ layer 105 has a higher bandgap energy than the $Al_yGa_{1-y}As$ layer 104. Similarly, holes injected into the n-type $Al_yGa_{1-y}As$ layer 104 do not diffuse into the n-type $Al_zGa_{1-z}As$ layer 103, which also has a higher bandgap energy.

Light emitted in the $Al_yGa_{1-y}As$ layer 104 is not absorbed at all in the $Al_xGa_{1-x}As$ layer 105, because the photon energy, which matches the bandgap energy of the $Al_yGa_{1-y}As$ layer 104, is less than the bandgap energy of the $Al_xGa_{1-x}As$ layer. The GaAs contact layer 106 has a smaller bandgap energy than the $Al_yGa_{1-y}As$ layer 104 and is capable of absorbing the emitted light, but the GaAs contact layer 106 has been removed by etching from the principal light-emitting area above the first diffusion area 110A, and the GaAs contact layer 106 that remains in the surrounding area is thin. Therefore, only a small amount of light is absorbed in the GaAs contact layer 106.

Light striking the underside of the p-electrode 108 is reflected back and absorbed inside the semiconductor substrate 100, but since the p-electrode 108 does not cover any part of the first diffusion area 110A, which is the main light-emitting area, little light is reflected in this way.

Accordingly, the structure of the first embodiment substantially prevents light emission from taking place below the p-electrode 108, where the emitted light would be reflected back and absorbed. Substantially all of the LED driving current is used to produce light emission near the pn junction in the first diffusion area 110A, where the light emitted upward escapes without being reflected or absorbed. The first embodiment therefore emits light with high efficiency, and the amount of light emitted is not limited by the size of the p-electrode 108, as it was in the conventional LED.

The etched zone 120 contributes to the high light-emitting efficiency by removing material in the GaAs contact layer 106 that would absorb the emitted light. In addition, removal of the material containing the lateral diffusion front in the etched zone 120 contributes to the high efficiency in another way.

The shape of the diffusion front 130 at the interface between the GaAs contact layer 106 and the $Al_xGa_{1-x}As$ layer 105 tends to be sharply irregular. If this irregular lateral part of the diffusion front 130 were not removed, then during operation, strong electric fields generated by the irregularities would inject minority carriers across the pn junction near the interface between the $Al_xGa_{1-x}As$ layer 105 and GaAs contact layer 106, causing these carriers to recombine in the $Al_xGa_{1-x}As$ layer 105 and GaAs contact layer 106. Light emitted by such recombination would have the wrong wavelength, as the bandgap energies of the $Al_xGa_{1-x}As$ layer 105 and GaAs contact layer 106 differ from the bandgap energy of the $Al_yGa_{1-y}As$ layer 104. Furthermore, some of the carrier recombination in the GaAs contact layer 106 and $Al_xGa_{1-x}As$ layer 105 would take place below the p-electrode 108, where the emitted light would be reflected.

Moreover, much of the carrier recombination taking place in the $Al_xGa_{1-x}As$ layer 105 and GaAs contact layer 106 would not be accompanied by light radiation. Near the upper surface of the device, in the GaAs contact layer 106 and near the interface between the semi-insulating GaAs contact layer 106 and $Al_xGa_{1-x}As$ layer 105, there are numerous crystal lattice defects, which can act as centers of nonradiative recombination. In particular, electrons injected into the p-type $Al_xGa_{1-x}As$ region 110b and diffusing into the p-type GaAs region 110a would be likely to undergo nonradiative recombination. The proportion of the driving current converted to light would therefore be reduced.

A further effect of the first embodiment is that the p-electrode 108 covers the entire p-type GaAs region 110a of each LED, as can be seen in FIG. 3, with sufficient margin that the contact area between the p-electrode 108 and the p-type GaAs region 110a in each LED is not affected by alignment error between the masks used to define the diffusion areas and electrode patterns. The contact resistance is therefore unaffected by mask alignment error, enabling a uniform driving current to be supplied to each LED in the array. Similarly, the light-emitting first diffusion area 110A is left entirely uncovered, with sufficient margin that mask alignment error does not alter the size of the exposed part of the first diffusion area 110A. The relation between driving current and emitted light is therefore the same for all LEDs in the array. As a result, the light-emitting characteristics of the LEDs in the array are highly uniform.

Figure 4:
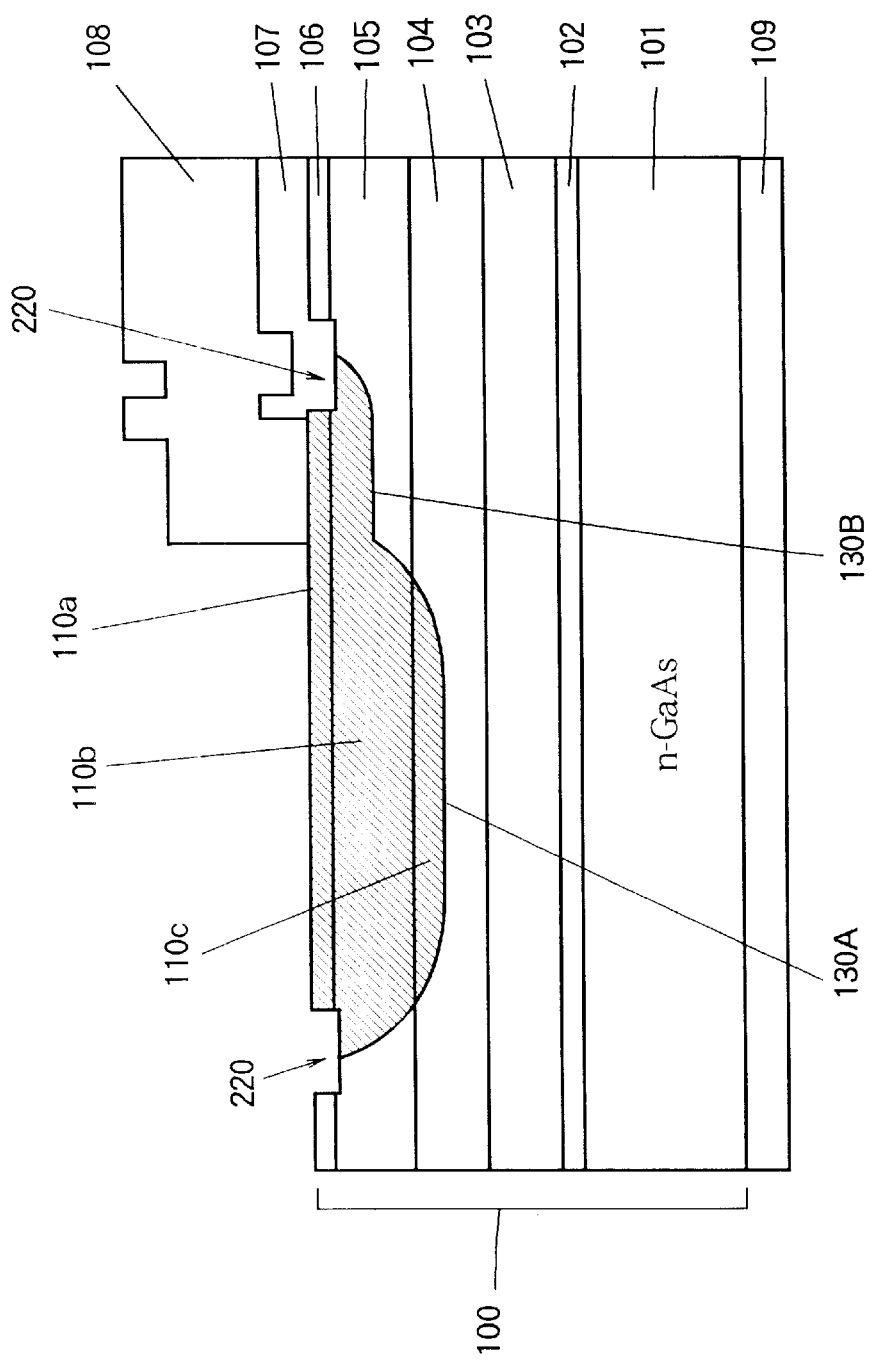
FIGS. 4 and 5 are sectional views illustrating variations of the first embodiment.

In a first variation of the first embodiment, illustrated in FIG. 4, the etched zone is reduced to a channel 220 disposed at the perimeter of the p-type diffusion area 110, so that the part of the GaAs contact layer 106 including the diffusion front 130 is removed, but most of the p-type GaAs region 110a is left, even in the first diffusion area 110A. Generally similar effects are obtained, but it is desirable for the GaAs contact layer 106 to be very thin (at most 500 Å, for example) to reduce absorption of light.

Figure 5:
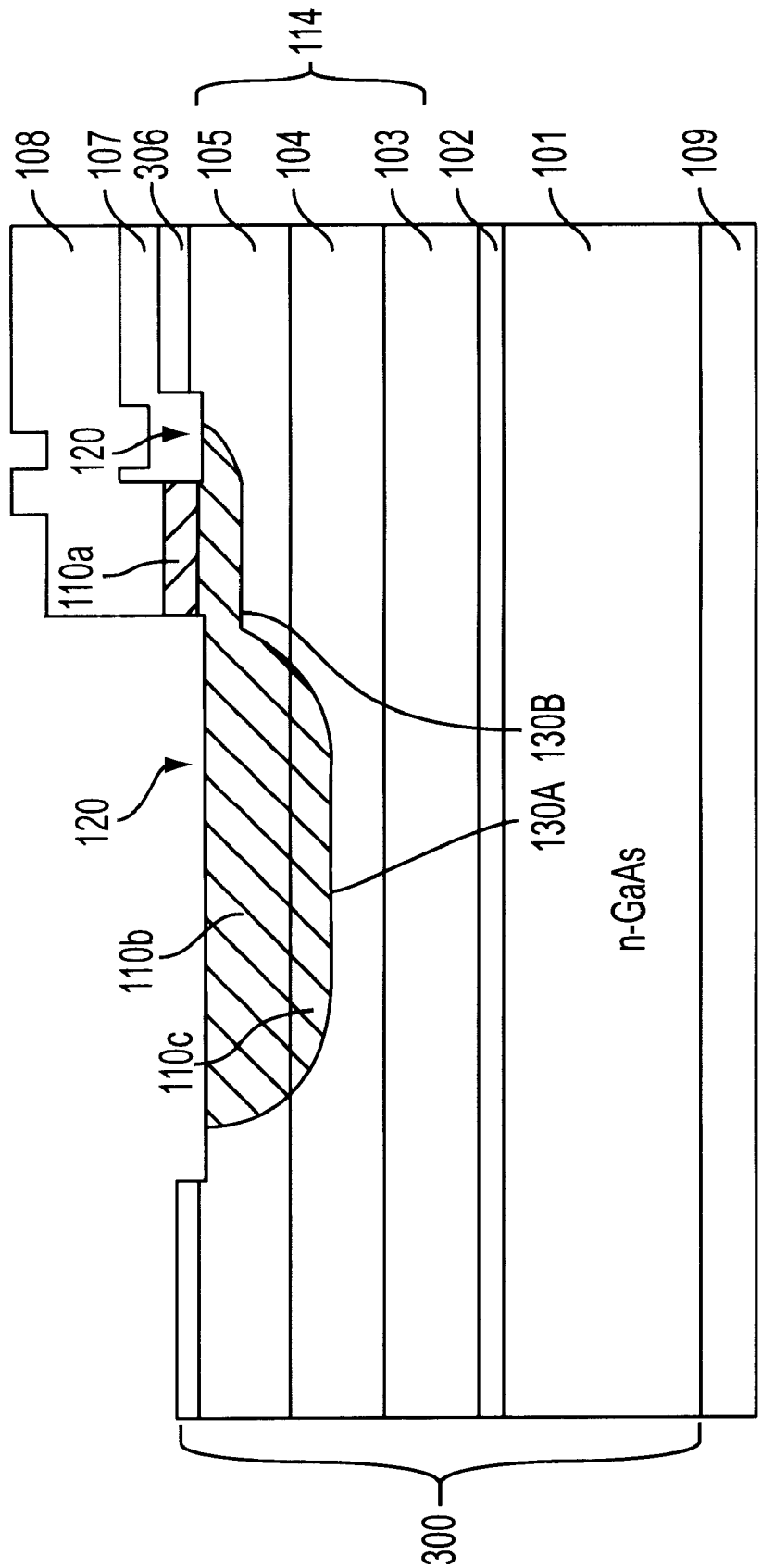

In a second variation, illustrated in FIG. 5, the semi-insulating GaAs contact layer 106 is replaced by an n-type GaAs contact layer 306. Diffusion of zinc still produces a p-type GaAs region 110a that can form an ohmic contact with the p-electrode 108. In this variation, the part of the lateral diffusion front 130 near the interface between the GaAs contact layer 306 and the $Al_xGa_{1-x}As$ layer 105 is less irregular, and does not have to be completely removed by etching. The depth of the etched zone 120 can therefore be reduced somewhat.

It is still desirable, however, to remove all material of the GaAs contact layer 306 that includes the diffusion front 130, so that no pn junction is left in the GaAs contact layer 306, because the GaAs contact layer 306 has a lower bandgap energy than the $Al_xGa_{1-x}As$ layer 105. If a pn junction were to be left in the GaAs contact layer 306, a substantial part of the forward current would flow across the pn junction in the GaAs contact layer 306. Much of the resulting carrier recombination would be nonradiative, due to crystal defects near the surface of the device, and even radiative recombination would produce light of a wavelength corresponding to the bandgap energy of the GaAs contact layer 306, rather than light of the desired wavelength corresponding to the bandgap energy of the $Al_yGa_{1-y}As$ layer 104.

Figure 6:
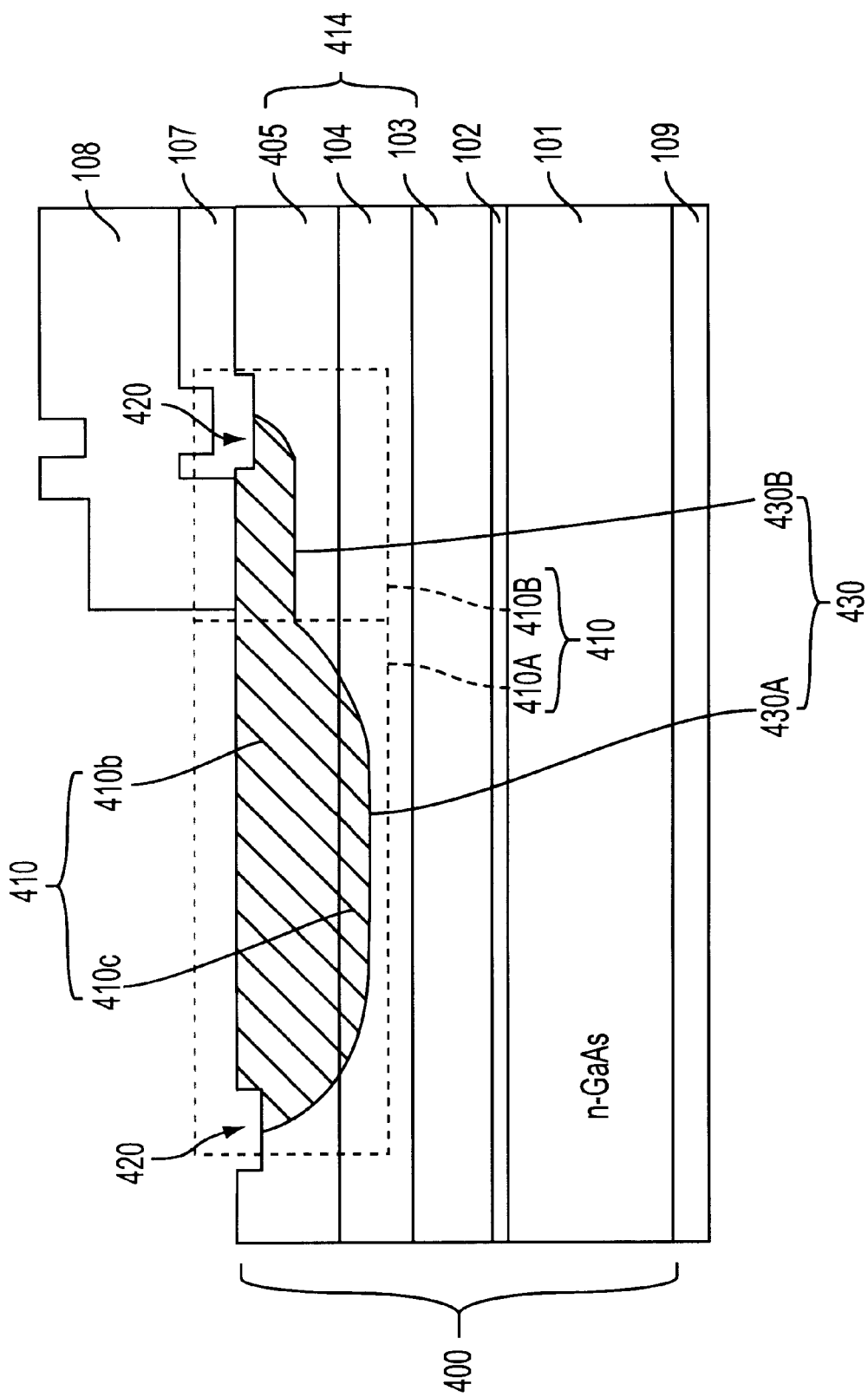
FIG. 6 is a sectional view of a second embodiment, illustrating the first aspect of the invention.

Next, a second embodiment will be described. Referring to FIG. 6, the second embodiment replaces the upper two layers of the semiconductor substrate in the first embodiment with a single n-type $Al_xGa_{1-x}As$ layer 405. The other layers of the semiconductor substrate 400, and the interlayer insulating film 107, p-electrode 108, and n-electrode 109, are as described in the first embodiment. The aluminum composition ratios x, y, z in the second embodiment satisfy the following conditions.

$0.2 \geq x > y \geq 0$ $1.0 \geq z > y \geq 0$

The bandgap energy of the $Al_yGa_{1-y}As$ layer 104 is accordingly lower than the bandgap energies of the $Al_zGa_{1-z}As$ layer 103 and $Al_xGa_{1-x}As$ layer 405. The reason for limiting x to a maximum value of 0.2 is to reduce the effect of the oxidation of aluminum in the $Al_xGa_{1-x}As$ layer 405 on the electrical contact between the $Al_xGa_{1-x}As$ layer 405 and p-electrode 108, so that an ohmic contact can be formed. The parameter x may be equal to 0.2.

A p-type diffusion area 410 is created as in the first embodiment, now comprising a p-type $Al_xGa_{1-x}As$ region 410b formed within the n-type $Al_xGa_{1-x}As$ layer 405, and a p-type $Al_yGa_{1-y}As$ region 410c formed within the n-type $Al_yGa_{1-y}As$ layer 104, with a stepped diffusion front 430 comprising a first diffusion front 430A extending into the $Al_yGa_{1-y}As$ layer 104 and a second diffusion front 430B terminating in the $Al_xGa_{1-x}As$ layer 405. The p-type diffusion area 410 thus comprises a first diffusion area 410A and a second diffusion area 410B, which are electrically continuous with one another. The first diffusion area 410A comprises the p-type $Al_yGa_{1-y}As$ region 410c and part of the p-type $Al_xGa_{1-x}As$ region 410b. The second diffusion area 410B comprises the remaining part of the p-type $Al_xGa_{1-x}As$ region 410b. The p-electrode 108 makes electrical contact with the p-type $Al_xGa_{1-x}As$ region 410b in the second diffusion area 410B, and does not cover any part of the first diffusion area 410A.

After the formation of the p-type diffusion area 410, a channel is etched around the perimeter of the p-type diffusion area 410 to remove material disposed near the surface of the $Al_xGa_{1-x}As$ layer 405, creating an etched zone 420. The material removed includes the portion of the pn junction between the p-type $Al_xGa_{1-x}As$ region 410b and n-type $Al_xGa_{1-x}As$ layer 405 disposed near the upper surface of the device.

Figure 7:
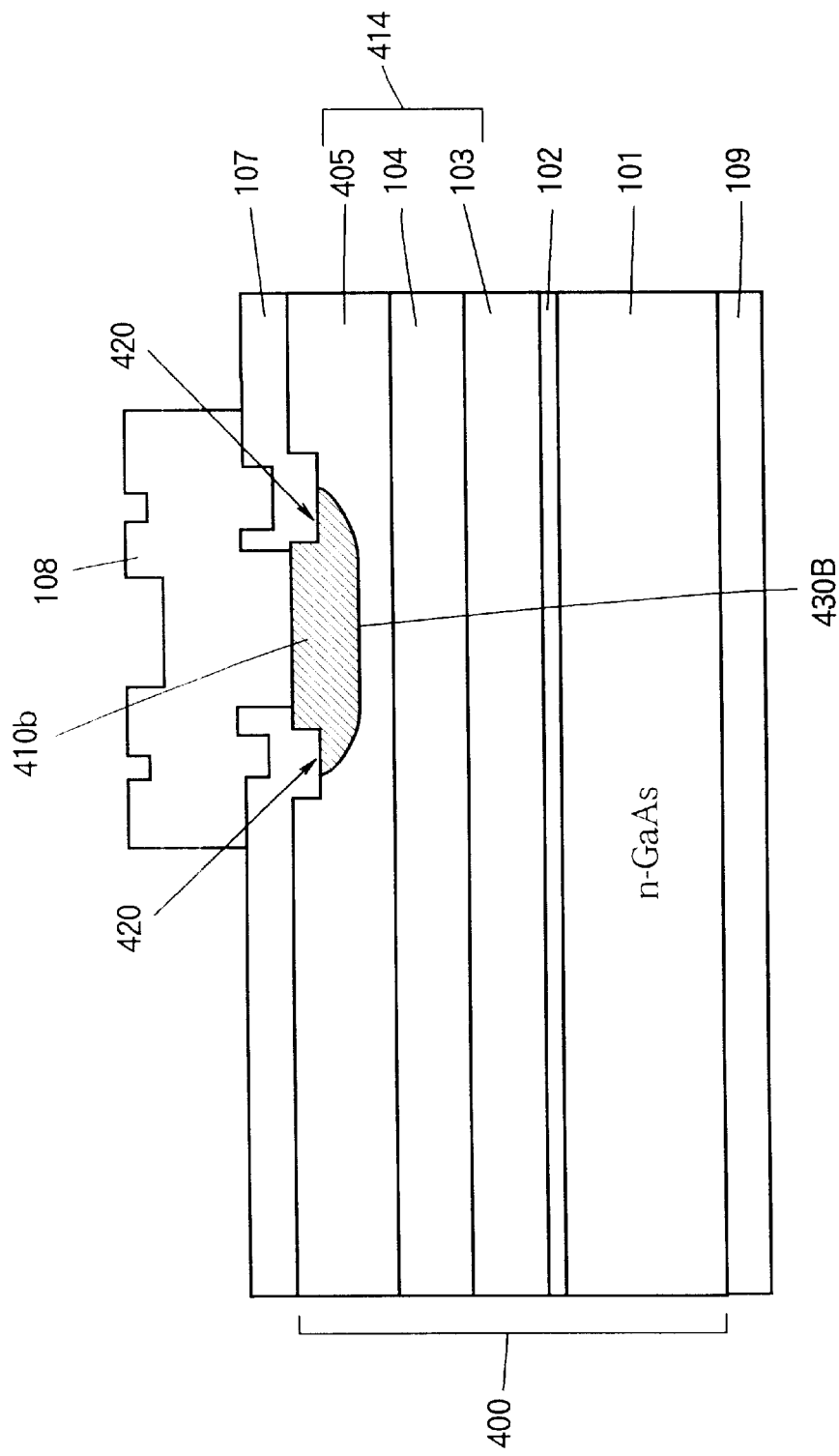
FIG. 7 is another sectional view of the second embodiment.

FIG. 7 shows a sectional view of the second embodiment at a right angle to the view in FIG. 6. In plan view, the second embodiment has substantially the same array configuration as the first embodiment, shown in FIG. 3. Thus FIG. 6 corresponds to a section through line 1—1 in FIG. 3, and FIG. 7 to a section through line 2—2 in FIG. 3.

The second embodiment operates substantially as described in the first embodiment. When a forward voltage is applied between the p-electrode 108 and n-electrode 109, forward current flows from the p-electrode 108 through the second diffusion area 410B into the first diffusion area 410A, across the pn junction at the first diffusion front 430A disposed in the $Al_yGa_{1-y}As$ layer 104, and through the n-type $Al_yGa_{1-y}As$ layer 104, n-type $Al_zGa_{1-z}As$ layer 103, n-type GaAs buffer layer 102, and n-type GaAs substrate layer 101 to the n-electrode 109. Minority carriers are injected preferentially across the pn junction in the $Al_yGa_{1-y}As$ layer 104, rather than across the pn junction in the $Al_xGa_{1-x}As$ layer 405, because the $Al_yGa_{1-y}As$ layer 104 has a lower bandgap energy. The injected carriers are confined to the $Al_yGa_{1-y}As$ layer 104 by the energy barrier existing between the $Al_yGa_{1-y}As$ layer 104 and $Al_xGa_{1-x}As$ layer 405, and the energy barrier existing between the $Al_yGa_{1-y}As$ layer 104 and $Al_zGa_{1-z}As$ layer 103. Light emitted upward in the $Al_yGa_{1-y}As$ layer 104 is transmitted through the $Al_xGa_{1-x}As$ layer 405 without being absorbed, because the $Al_xGa_{1-x}As$ layer 405 has a higher bandgap energy, and is emitted from the surface of the device.

The effects of the second embodiment are substantially the same as in the first embodiment. Efficiency is high, because almost all of the driving current produces carrier recombination in and near the p-type $Al_yGa_{1-y}As$ region 410c, none of the resulting light is absorbed in the overlying p-type $Al_xGa_{1-x}As$ region 410b, or the surrounding parts of the $Al_xGa_{1-x}As$ layer 405, and very little of the light is reflected by the p-electrode 108. The wavelength of the emitted light is controlled by the composition ratio y. The emission characteristics of the individual LEDs in the array are comparatively uniform, because the entire light-emitting surface area of the first diffusion area 410A is left uncovered, and the size of the light-emitting area is not greatly affected by mask alignment errors. The second embodiment also has the virtue of reduced cost, as compared with the first embodiment, because the semiconductor substrate 400 has one less layer.

Figure 8:
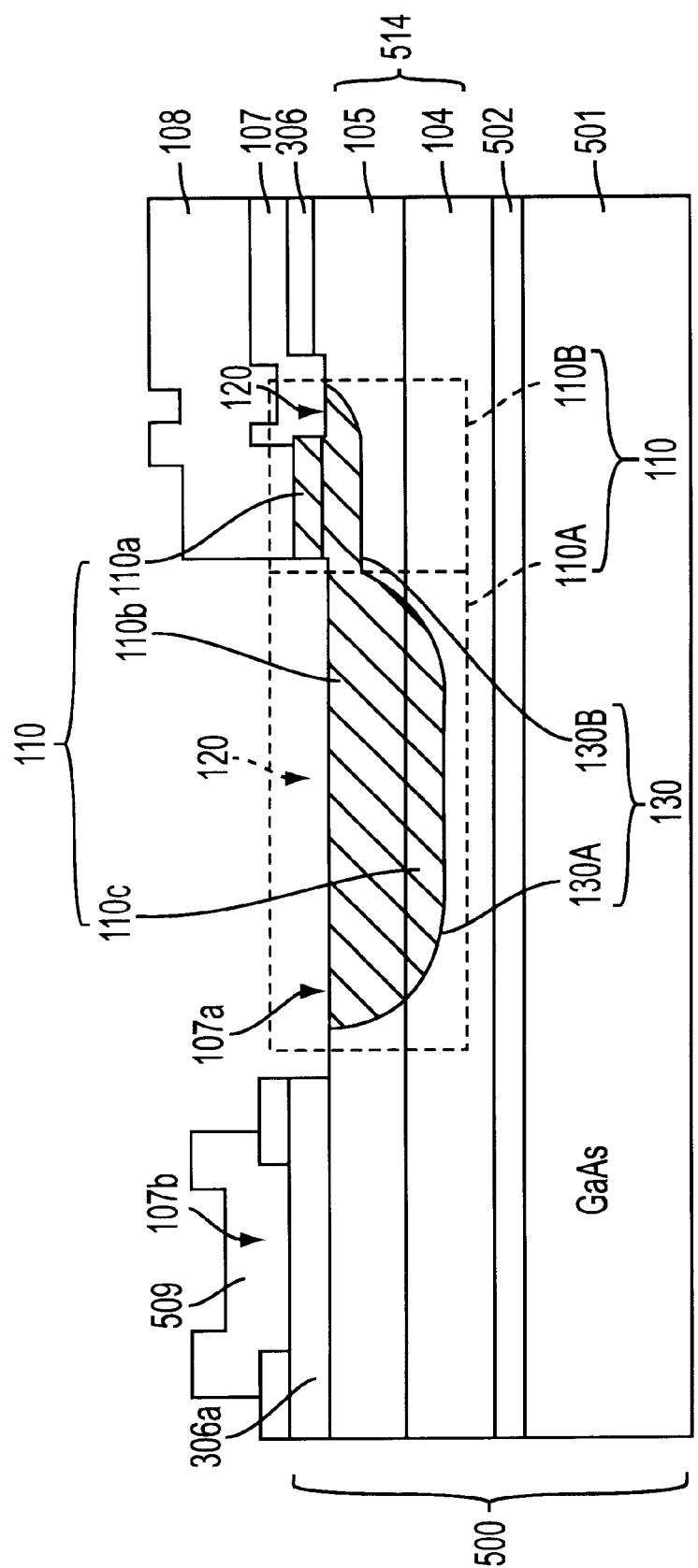
FIG. 8 is a sectional view of a third embodiment, illustrating the first aspect of the invention.

Next, a third embodiment will be described. Referring to FIG. 8, the semiconductor substrate 500 in the third embodiment comprises, from bottom to top, a semi-insulating GaAs substrate layer 501, a semi-insulating GaAs buffer layer 502, the same $Al_yGa_{1-y}As$ layer 104 and $Al_xGa_{1-x}As$ layer 105 as in the first embodiment, and the same n-type GaAs contact layer 306 as in the second variation of the first embodiment. The inter-layer insulating film 107, p-electrode 108, and etched zone 120 are generally similar to the corresponding elements in the first embodiment. The interlayer insulating film 107 has openings 107a and 107b. An n-electrode 509 comprising, for example, a gold alloy is formed on the upper surface of the device, making ohmic contact with the n-type GaAs contact layer 306 through opening 107b in the inter-layer insulating film 107.

The aluminum composition ratios x and y in the AlGaAs layers 514 satisfy the same conditions as in the first embodiment.

$$1 \geq x > y \geq 0$$

A p-type diffusion area 110 is formed beneath opening 107a in the inter-layer insulating film 107. As in the first embodiment, the p-type diffusion area 110 comprises a first diffusion area 110A and a second diffusion area 110B. The stepped diffusion front 130 comprises a first diffusion front 130A disposed in the first diffusion area 110A, and a more shallow second diffusion front 130B in the second diffusion area 110B. Part of the n-type GaAs contact layer 306 becomes a p-type GaAs region 110a, which is left as an island in the etched zone 120 in the second diffusion area 110B. Similarly, part of the n-type $Al_xGa_{1-x}As$ layer 105 becomes a p-type $Al_xGa_{1-x}As$ region 110b, and part of the n-type $Al_yGa_{1-y}As$ layer 104 becomes a p-type $Al_yGa_{1-y}As$ region 110c. The depth of the etched zone 120 is the same as in the first embodiment.

Figure 9:
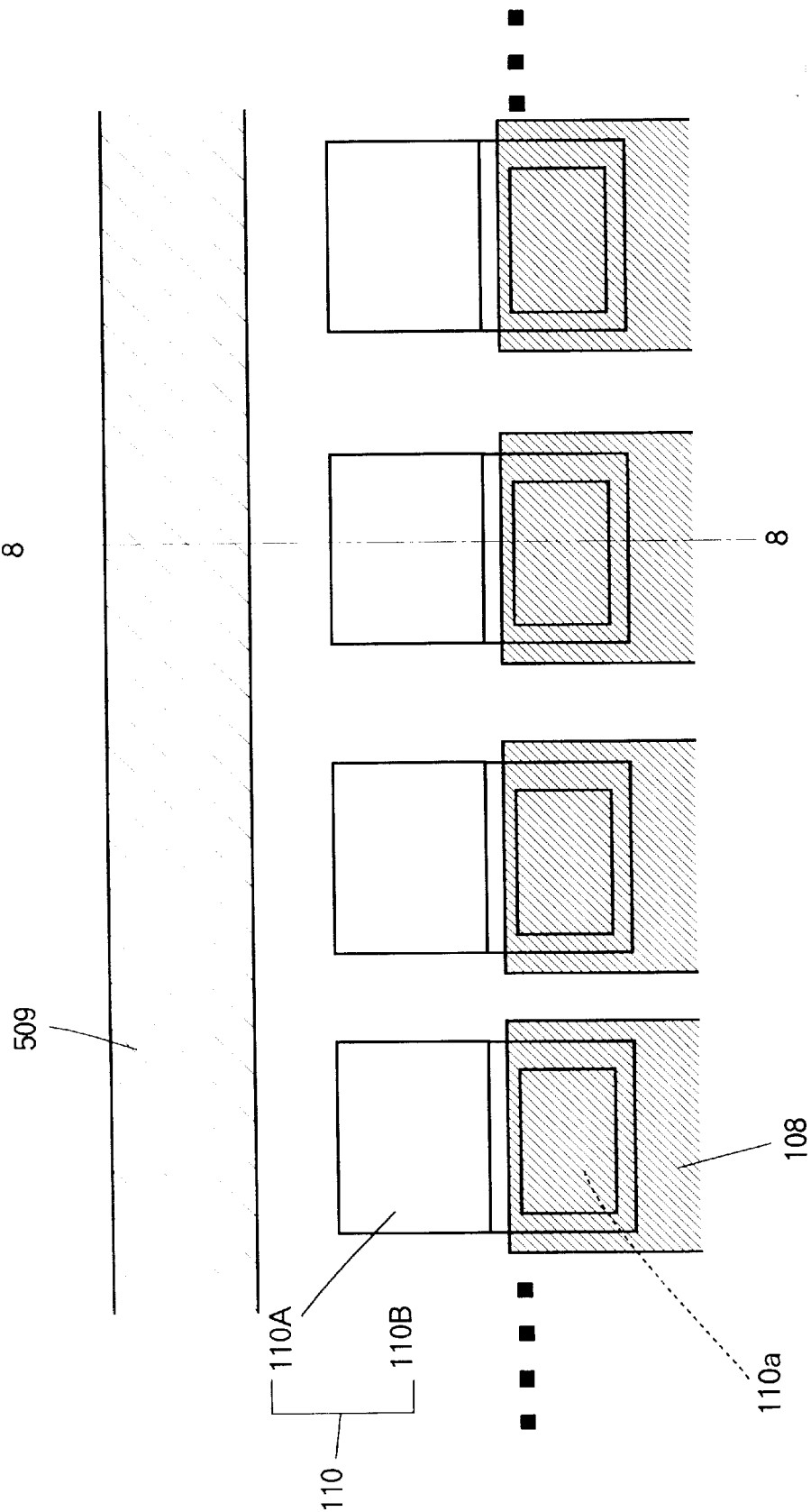
FIG. 9 is a plan view of the third embodiment.

FIG. 9 shows a plan view of the third embodiment. The n-electrode 509 extends parallel to the array of LEDs, and may be shared by all of the LEDs in the array. FIG. 8 is a section through line 8—8 in FIG. 9.

The third embodiment operates substantially as described in the first embodiment. When a forward voltage is applied between the p-electrode 108 and n-electrode 509, forward current flows from the p-electrode 108 through the second diffusion area 110B into the first diffusion area 110A, and minority carriers are injected across the pn junction in the $Al_yGa_{1-y}As$ layer 104. The injected minority carriers are confined in the $Al_yGa_{1-y}As$ layer 104 by the energy barrier between the $Al_yGa_{1-y}As$ layer 104 and $Al_xGa_{1-x}As$ cladding layer 105. Although no cladding layer is provided below the $Al_yGa_{1-y}As$ layer 104, the ambient electric field attracts the injected carriers toward the $Al_xGa_{1-x}As$ layer 105, rather than toward the semi-insulating GaAs layers 502, 501, and in any case, these semi-insulating layers 502, 501 provide few carriers with which the injected minority carriers might recombine, Light emission accordingly takes place in the $Al_yGa_{1-y}As$ layer 104, including the p-type $Al_yGa_{1-y}As$ region 110c, as in the first embodiment. The flow of current continues through the n-type $Al_yGa_{1-y}As$ layer 104, n-type $Al_xGa_{1-x}As$ layer 105, and n-type GaAs contact layer 306 to the n-electrode 509.

The third embodiment provides the same efficient, uniform light emission characteristics as the first embodiment. Compared with the first embodiment, the cost of the semiconductor substrate 500 is reduced by the elimination of the lower cladding layer. In addition, all external electrical connections can be made on the same surface of the device.

In a variation of the third embodiment, the etched zone 120 is reduced to a channel following the perimeter of the p-type diffusion area 110, removing the part of the GaAs contact layer 306 including the diffusion front 130, so that no pn junction is formed in the GaAs contact layer 306, but leaving the p-type GaAs region 110a in place over most of the p-type diffusion area 110. The thickness of the GaAs contact layer 306 in this case is preferably five hundred angstroms or less, to reduce absorption of light.

In another variation, the depth of the etched zone 120 is reduced, so that the lateral part of the diffusion front 130 disposed in the GaAs contact layer 306 is removed, but the part disposed in the $Al_xGa_{1-x}As$ layer 105 is not removed, even near the interface with the GaAs contact layer 306.

Figure 10:
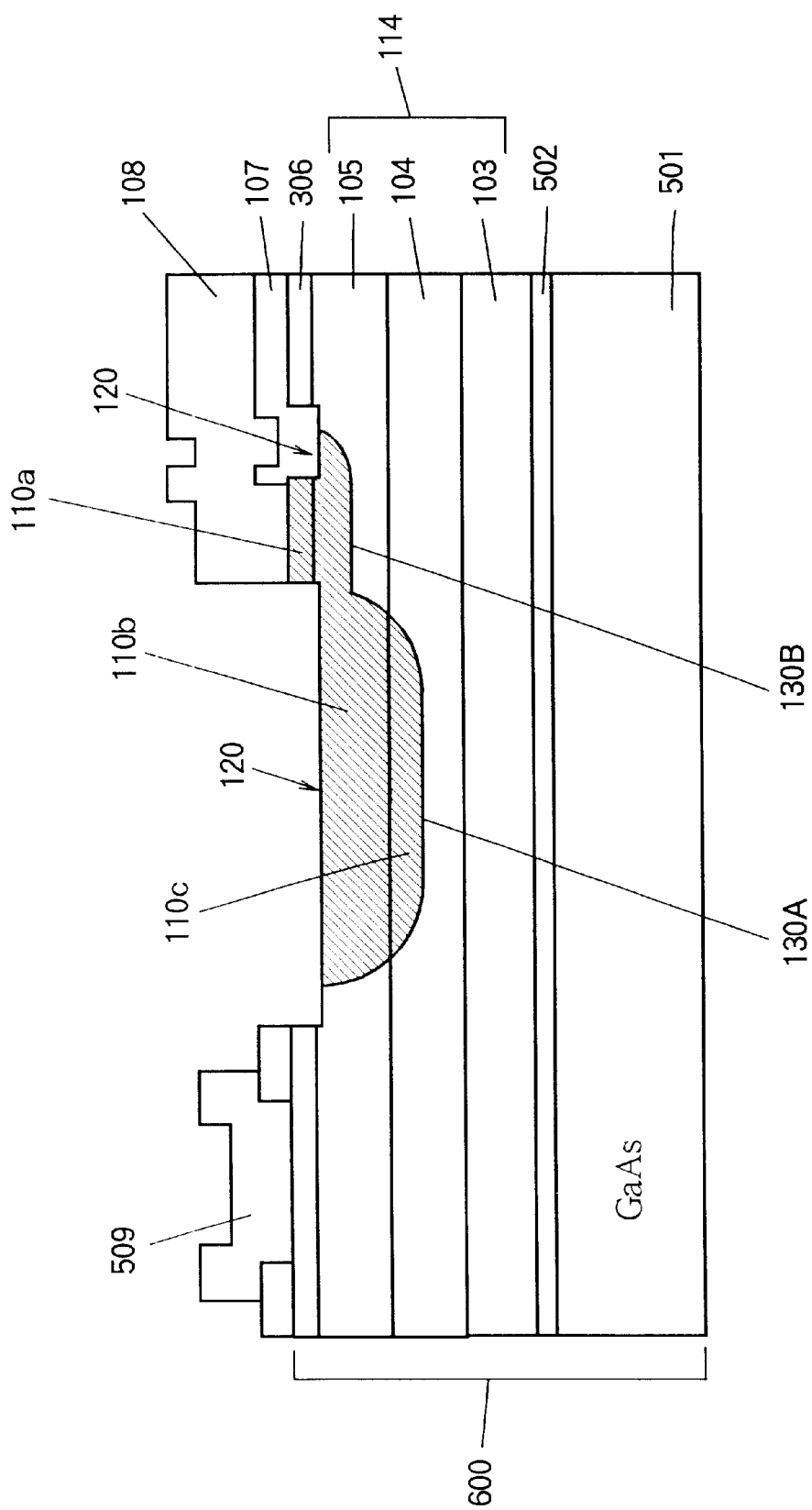
FIGS. 10, 11, 12, and 13 are sectional views illustrating variations of the third embodiment.
Figure 11:
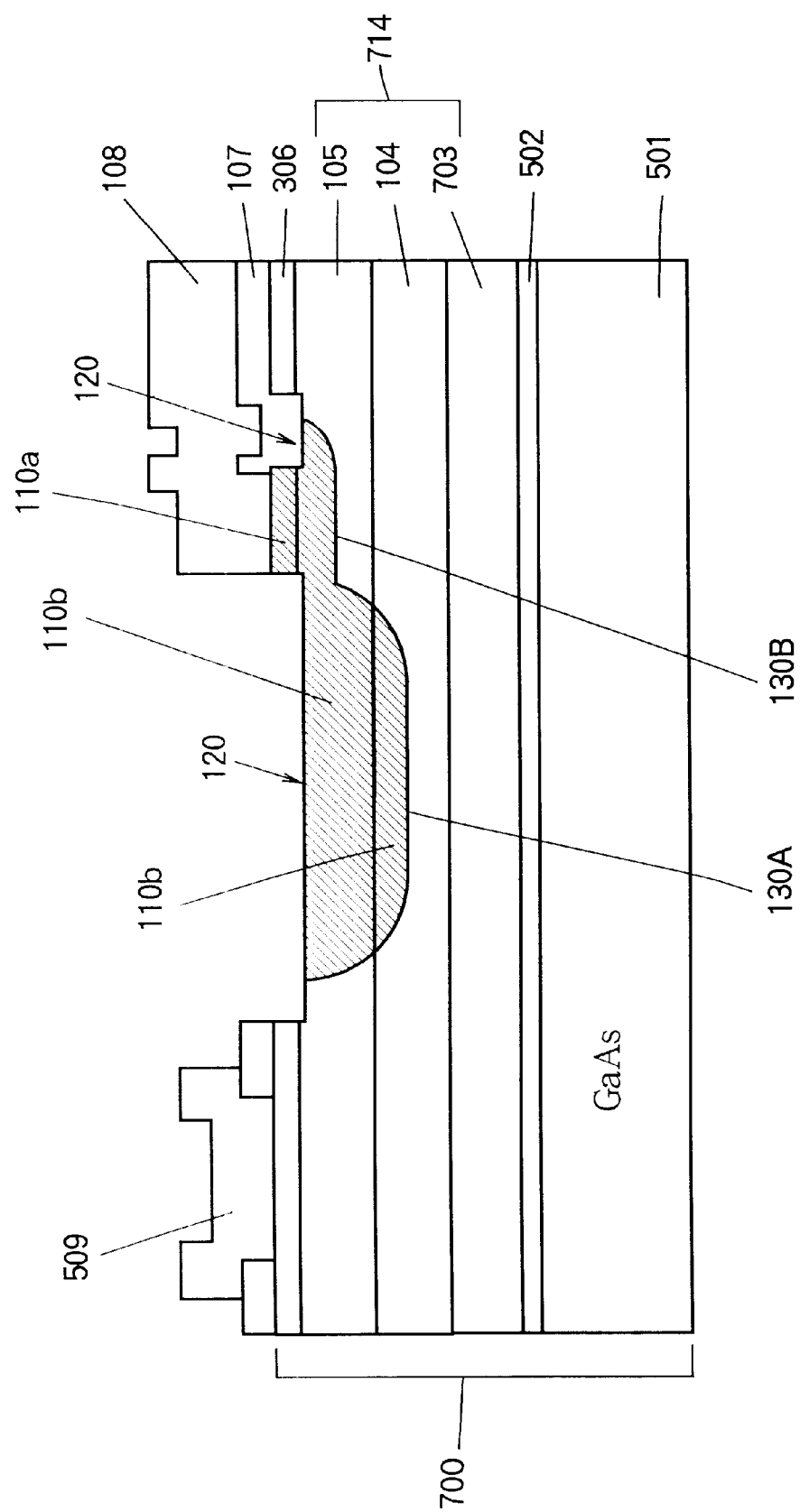
Figure 12:
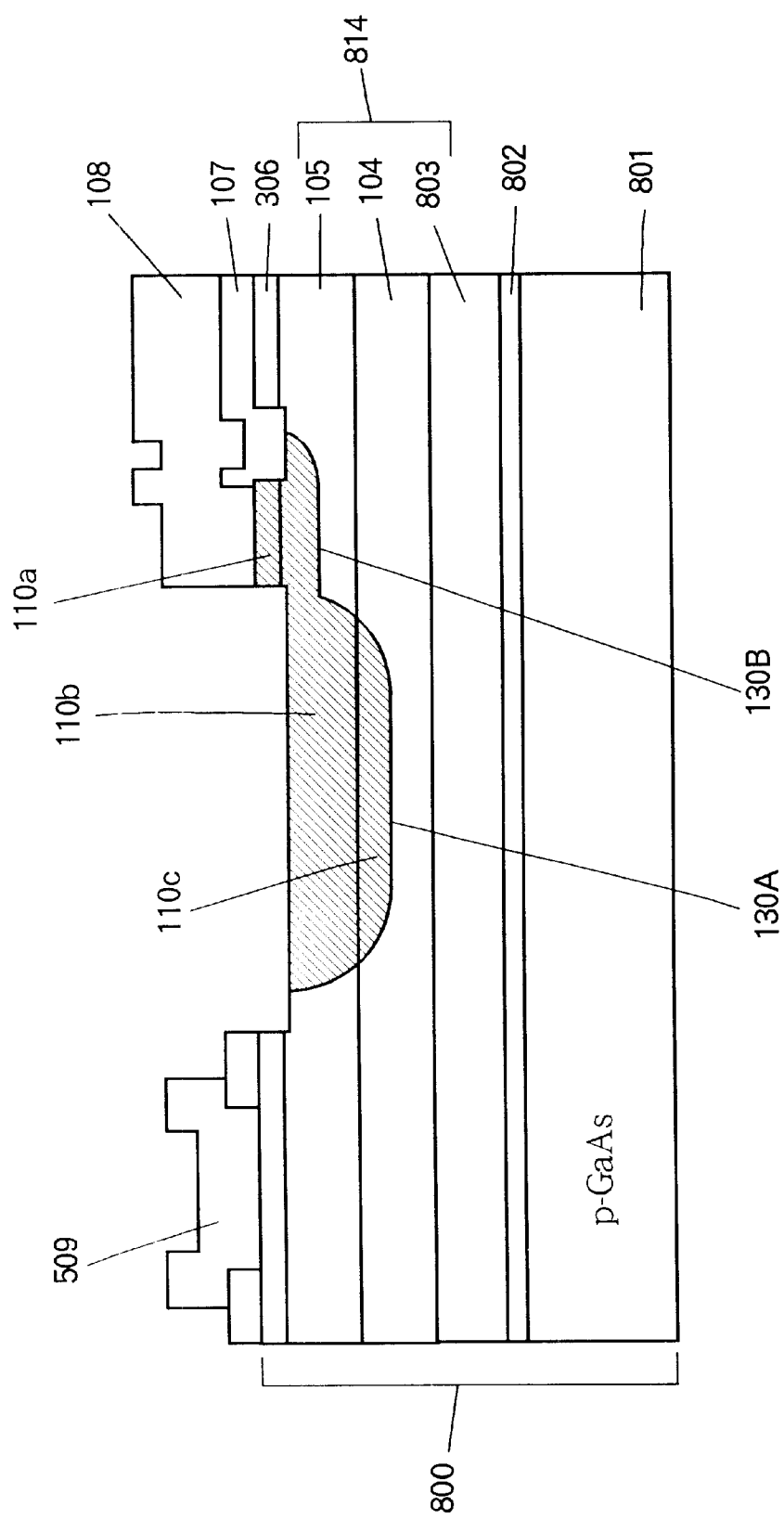

In another variation, a lower cladding layer is added between the semi-insulating GaAs buffer layer 502 and the light-emitting layer 104. This lower cladding layer may be an n-type layer, a semi-insulating layer, or a p-type layer. If the lower cladding layer is an n-type layer, the underlying GaAs layers 501, 502 may also be n-type layers. If the lower cladding layer is a p-type layer, the underlying GaAs layers 501, 502 may also be p-type layers. FIGS. 10, 11, and 12 show a few examples of the possible layer configurations. As a lower cladding layer, the semiconductor substrate 600 in FIG. 10 has the same n-type $Al_zGa_{1-z}As$ layer 103 as in the first embodiment, and the underlying GaAs layers 501, 502 are semi-insulating layers. The semiconductor substrate 700 in FIG. 11 has a semi-insulating $Al_zGa_{1-z}As$ layer 703 as its lower cladding layer, the underlying GaAs layers 501, 502 again being semi-insulating layers. The semiconductor substrate 800 in FIG. 12 has a p-type GaAs substrate layer 801, a p-type GaAs buffer layer 802, and a p-type $Al_zGa_{1-z}As$ lower cladding layer 803. The aluminum composition ratios x, y, and z in these examples satisfy the same conditions as in the first embodiment. The bandgap energies of the semi-insulating $Al_zGa_{1-z}As$ layer 703 and p-type $Al_zGa_{1-z}As$ layer 803 are, for example, identical to the bandgap energy of the $Al_zGa_{1-z}As$ layer 103.

In another variation of the third embodiment, the n-type GaAs contact layer 306 is eliminated and the value of the aluminum composition ratio x of the $Al_xGa_{1-x}As$ layer 105 is reduced to 0.2 or less, permitting an ohmic contact to be formed directly between the p-type $Al_xGa_{1-x}As$ region 10b and the p-electrode 108, as in the second embodiment. An ohmic contact is also formed directly between the n-type $Al_xGa_{1-x}As$ layer 105 and the n-electrode 509.

Figure 13:
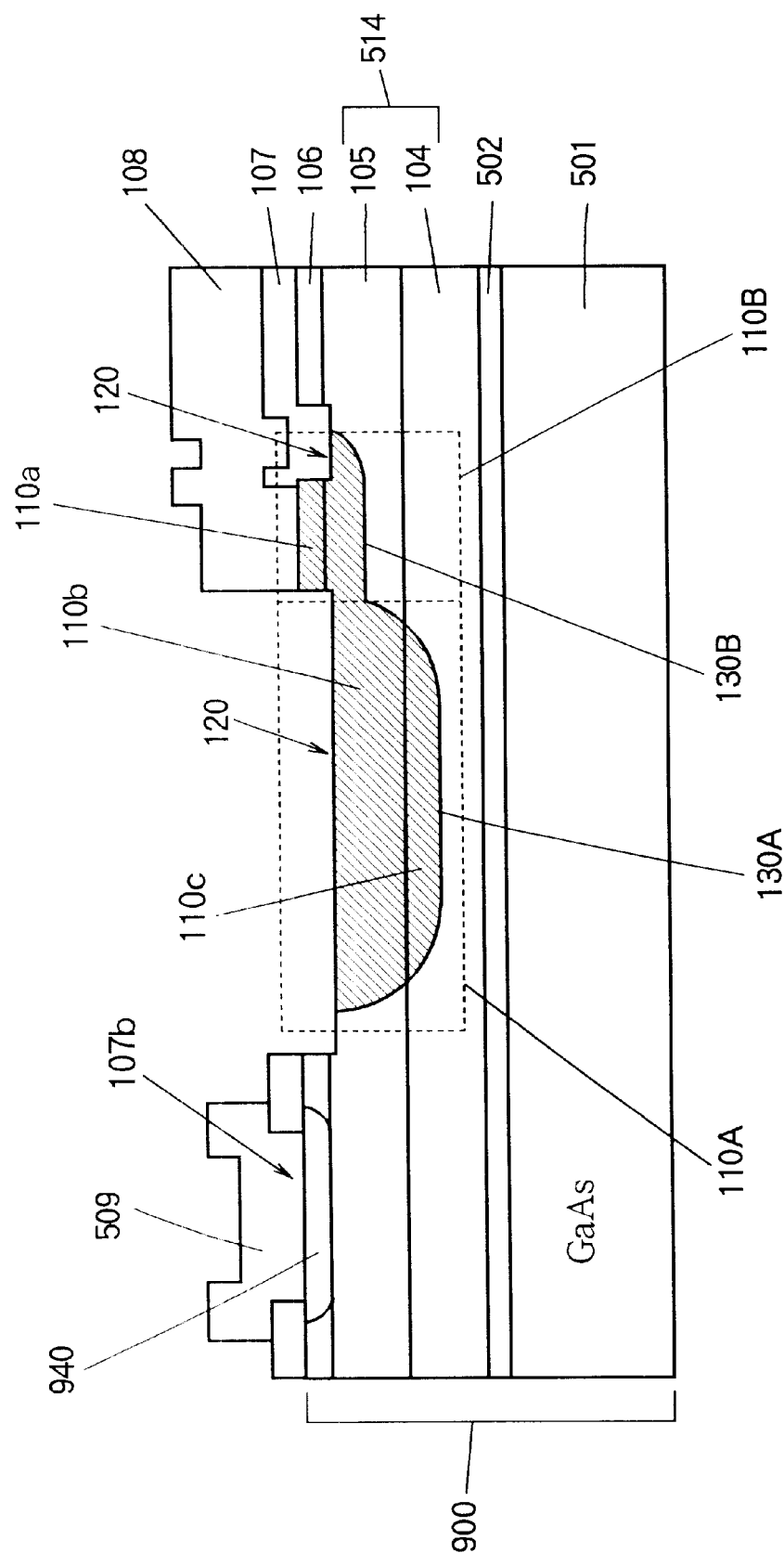

In yet another variation, illustrated in FIG. 13, the semiconductor substrate 900 has an uppermost semi-insulating GaAs contact layer 106, as in the first embodiment. An n-type impurity such as tin (Sn) or silicon (Si) is selectively diffused into the semi-insulating GaAs contact layer 106 to form an n-type diffusion area 940 extending to the $Al_xGa_{1-x}As$ layer 105 below opening 107b in the inter-layer insulating film 107. The diffusion front of the n-type diffusion area 940 extends into the n-type AlGaAs layers 514. The n-electrode 509 makes ohmic contact with the n-type diffusion area 940, which provides electrical continuity between the n-electrode 509 and these AlGaAs layers 514.

Figure 14:
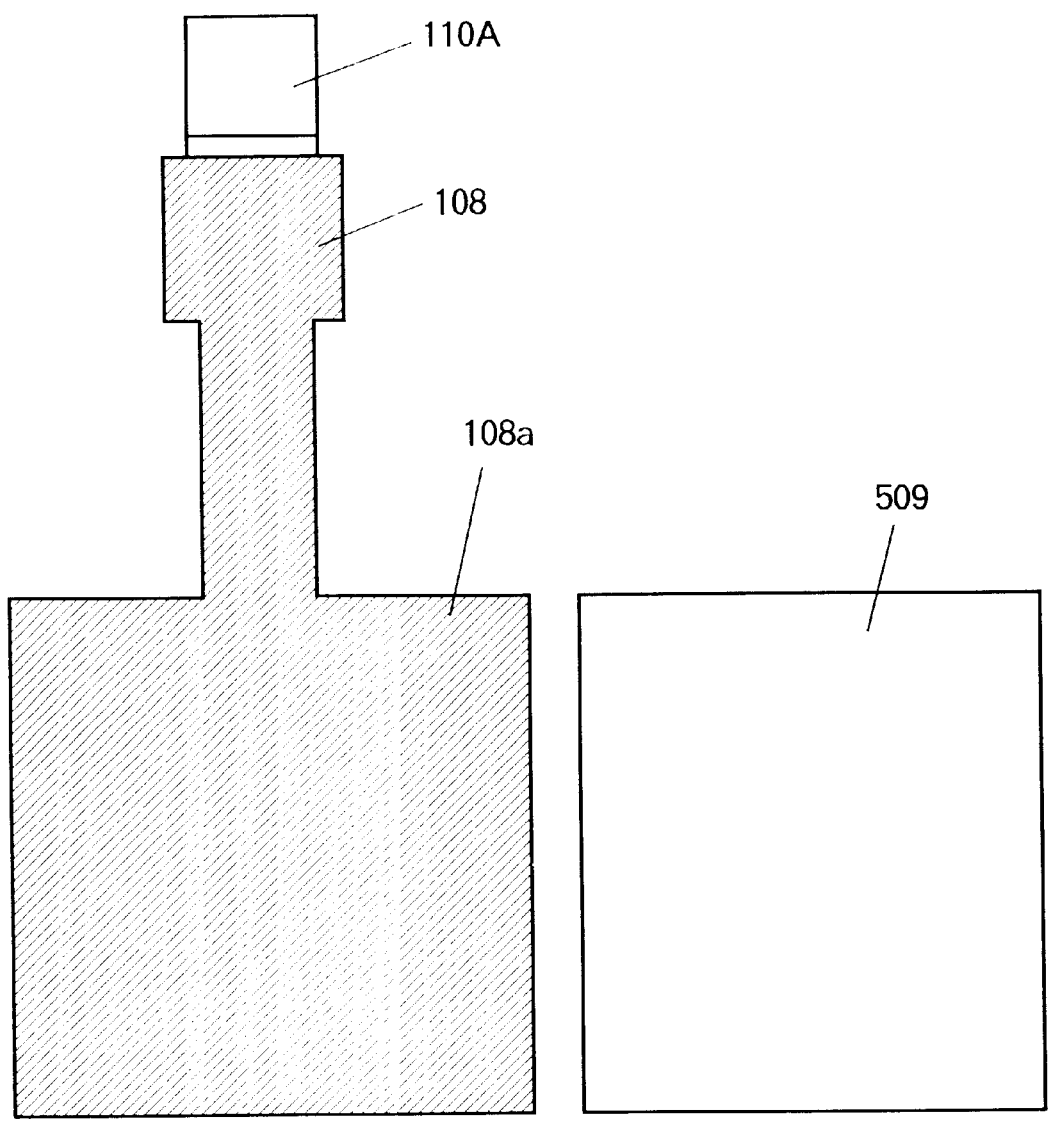
FIG. 14 is a plan view illustrating another variation of the third embodiment.

The shape and location of the n-electrode 509 are not limited to the shape and location shown in FIG. 9. The shape and location of the n-electrode 509 can be chosen so as to reduce the size of the device, for example, or so as to simplify wire bonding. FIG. 14 illustrates a variation in which the n-electrode 509 has the form of a square wire bonding pad, disposed adjacent a similar wire bonding pad 108a forming part of a p-electrode 108.

Figure 15:
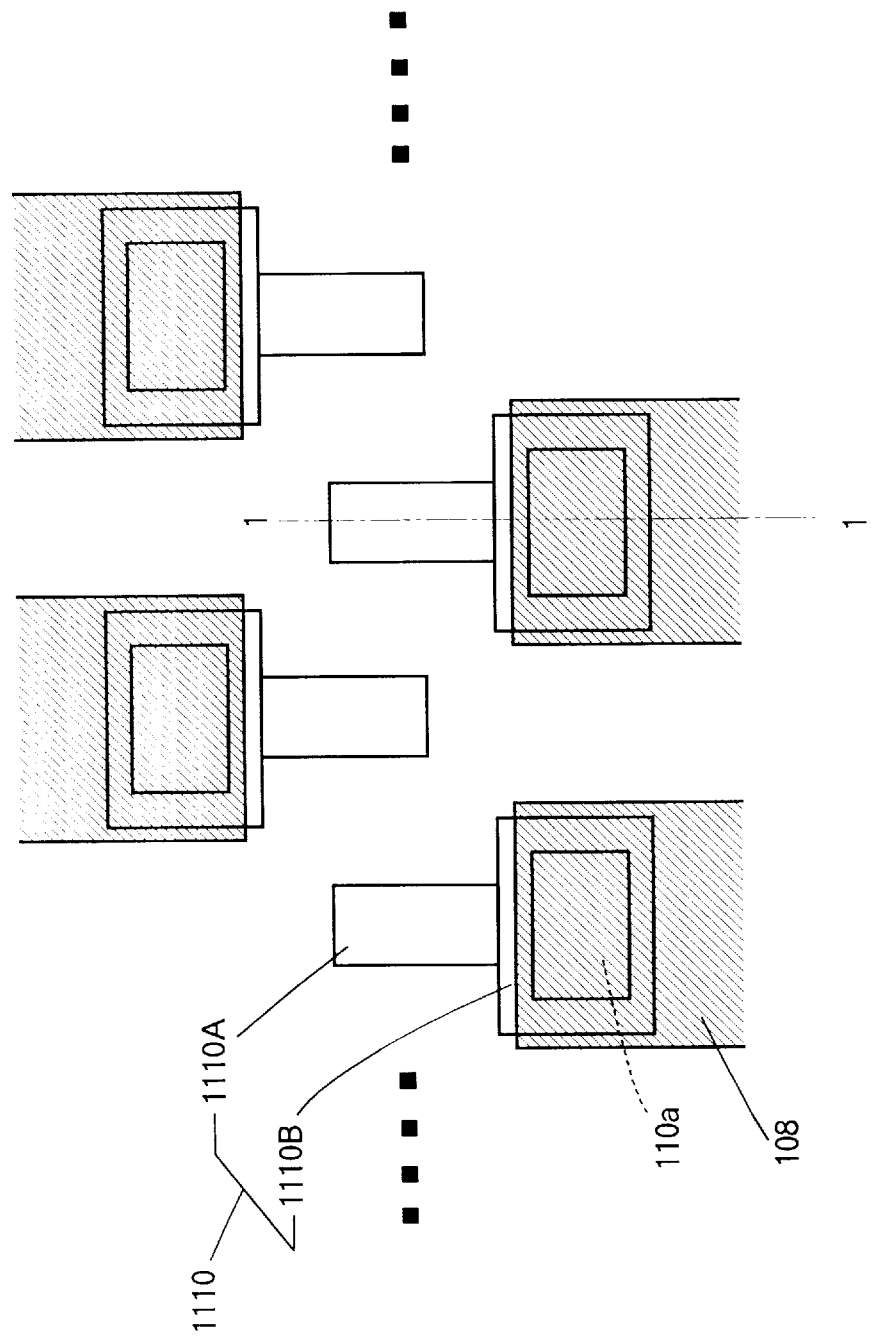
FIG. 15 is a plan view of a fourth embodiment, illustrating the first aspect of the invention.

FIG. 15 shows a plan view of a fourth embodiment, in which the first diffusion areas 1110A are more narrow than the second diffusion areas 1110B, and the p-electrodes 108 are disposed on alternate sides of the first diffusion areas 1110A in the array. This layout enables the light-emitting first diffusion areas 1110A to be more densely arranged than in the preceding embodiments, while still allowing adequate contact area between the p-electrodes 108 and the second diffusion areas 1110B. The fourth embodiment employs the same semiconductor substrate 100, inter-layer insulating film 107, p-electrodes 108, and n-electrode 109 as in the first embodiment, and has the sectional structure shown in FIG. 1. Only the shape of the p-type diffusion area 1110 is altered.

Figure 16:
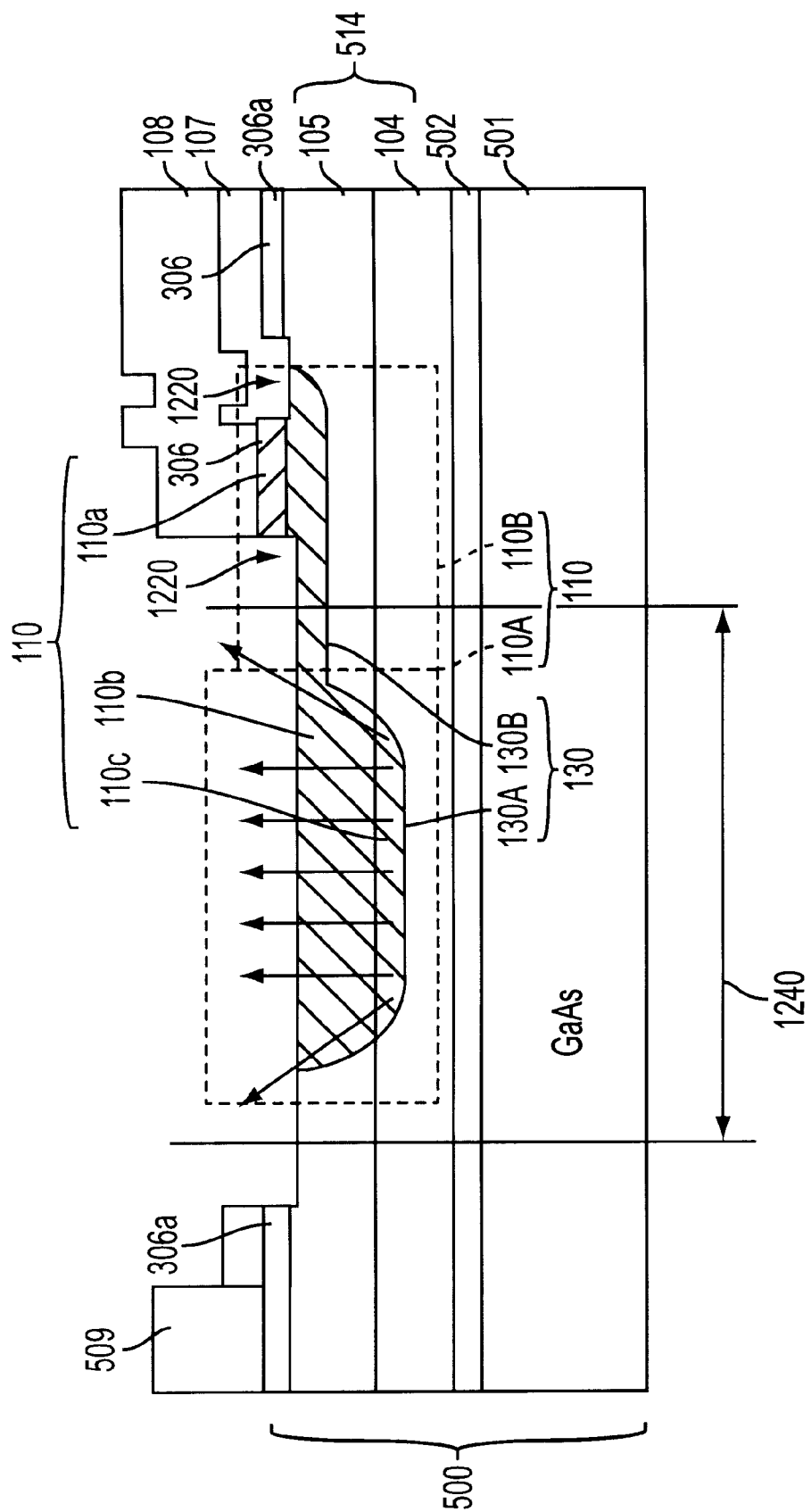
FIG. 16 is a sectional view of a fifth embodiment, illustrating the first aspect of the invention.

FIG. 16 shows a sectional view of a fifth embodiment. The semiconductor substrate 500 has the same structure as in the third embodiment. The difference from the third embodiment is that the second diffusion area 110B is elongated and the etched zone 1220 is enlarged, to provide a greater unobstructed light-emitting area 1240. The other elements are identical to the corresponding elements in the third embodiment. The n-type GaAs contact layer 306 is entirely removed from the light-emitting area 1240.

Figure 17:
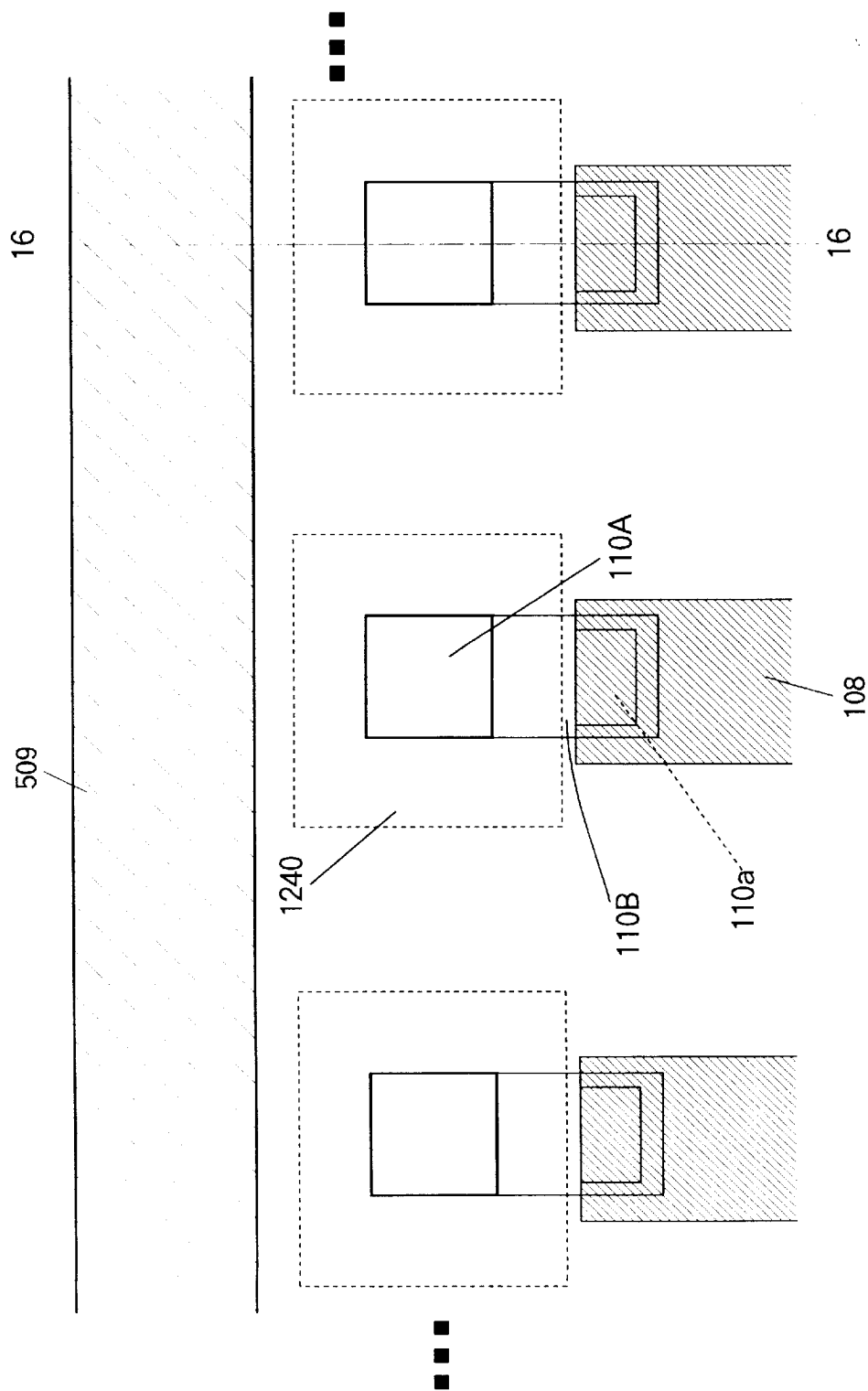
FIG. 17 is a plan view of the fifth embodiment.

As illustrated in FIG. 16, the fifth embodiment provides an unobstructed escape path for light that is emitted not only straight upward, but also at oblique upward angles. By moving the p-electrode 108, n-type GaAs contact layer 306a, and n-electrode 509, which would block or absorb some of the light, away from the recombination area in the $Al_yGa_{1-y}As$ layer 104 where the light is generated, the fifth embodiment enables more of the light to reach the outside. The plan view in FIG. 17 illustrates the elongated second diffusion area 110B and the large unobstructed light-emitting area 1240. FIG. 16 is a sectional view along line 16—16 in FIG. 17.

The fifth embodiment operates in the same way as the third embodiment, and provides similar effects, but emits light even more efficiently.

Part of the effect of the fifth embodiment can be obtained by lengthening the second diffusion area 110B without enlarging the etched zone. The p-type GaAs region 110a can also be left unetched inside the first diffusion area 110A, provided the part including the diffusion front 130 is removed, so that no pn junction is left in the GaAs contact layer 306, and provided the GaAs contact layer 306 is thin enough (e.g., 500 Å or less) not to cause significant light absorption.

Since the GaAs contact layer 306 is an n-type layer, the etched zone 1220 does not necessarily have to extend into the $Al_xGa_{1-x}As$ layer 105; the etch can be controlled to stop at the interface between the GaAs contact layer 306 and the $Al_xGa_{1-x}As$ layer 105, leaving AlGaAs material in this interface region, provided that the part of the GaAs contact layer 306 including the pn junction is completely removed.

Figure 18:
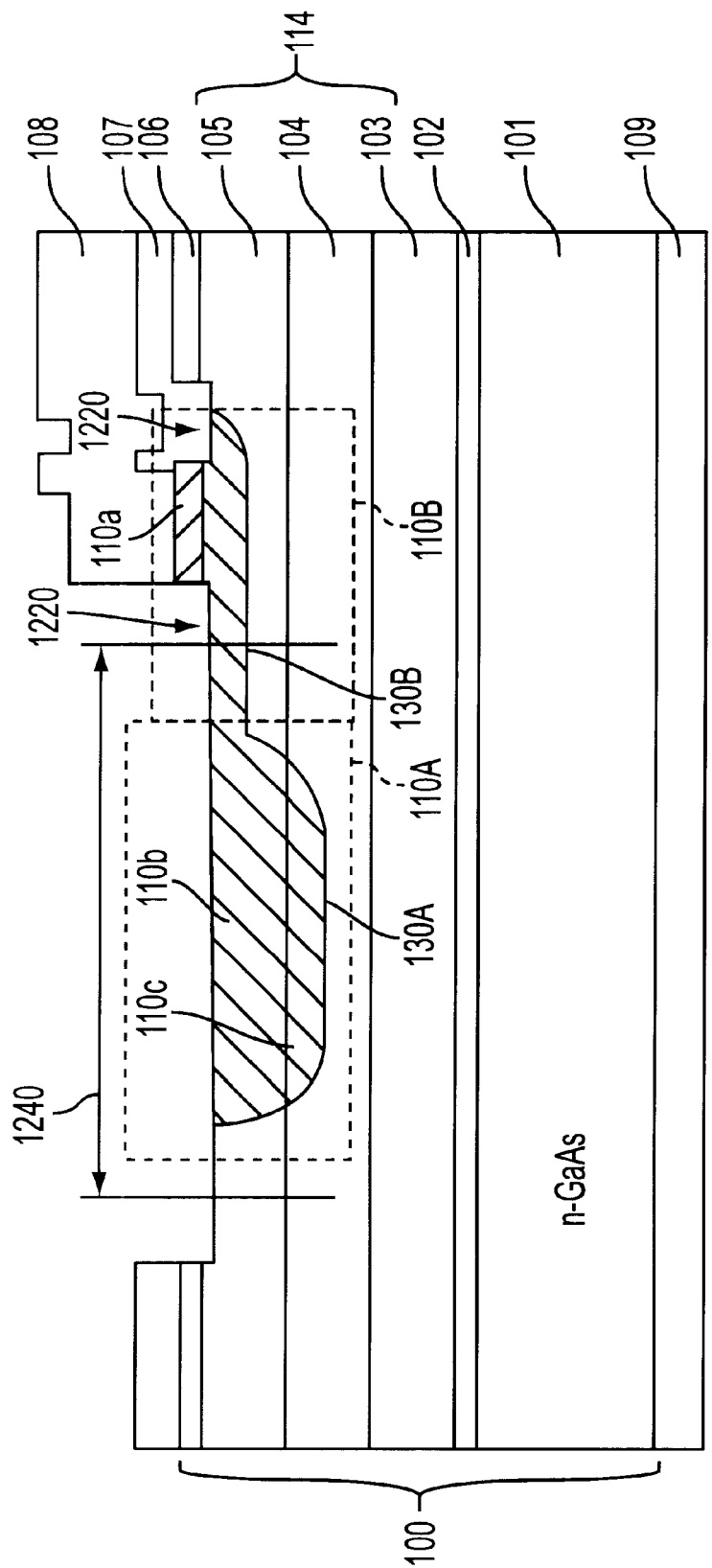
FIG. 18 is a sectional view illustrating a variation of the fifth embodiment.

The semiconductor substrate 500 can be modified as described in the third embodiment and illustrated in FIGS. 10, 11, 12, and 13, for example. It is also possible to use the type of semiconductor substrate 100 shown in the first embodiment, with an n-electrode 109 disposed on the underside of the device, as illustrated in FIG. 18.

Alternatively, the type of semiconductor substrate used in the second embodiment can be employed, the aluminum composition ratio x of the $Al_xGa_{1-x}As$ layer 105 being equal to or less than 0.2, so that an ohmic contact is formed directly between the p-electrode 108 and the p-type $Al_xGa_{1-x}As$ region 110b, and an ohmic contact is also formed directly between the n-electrode 509 and the n-type $Al_xGa_{1-x}As$ layer 105. In this case there is no GaAs contact layer to be removed by etching, and the etched zone 1220 only needs to be large enough to remove the material including the diffusion front 130, hence the pn junction, from the region near the surface of the device.

Figure 19:
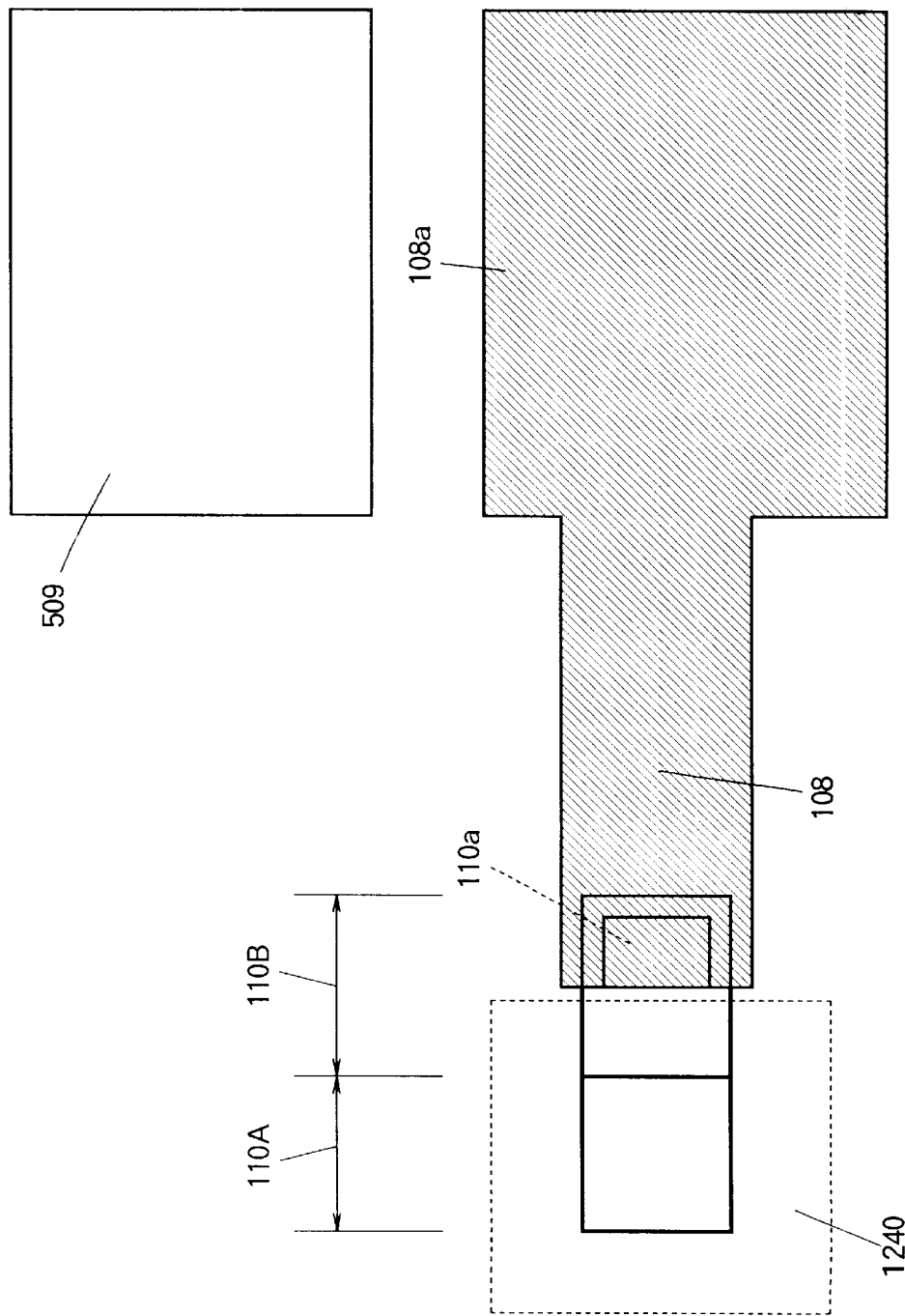
FIGS. 19 and 20 are plan views illustrating other variations of the fifth embodiment.

The n-electrode 509 can be disposed in any location far enough from the light-emitting area 1240 so as not to block the emitted light. For example, the n-electrode 509 can have the form of a wire bonding pad disposed next to a wire bonding pad 108a terminating a p-electrode 108, as shown in FIG. 19.

Figure 20:
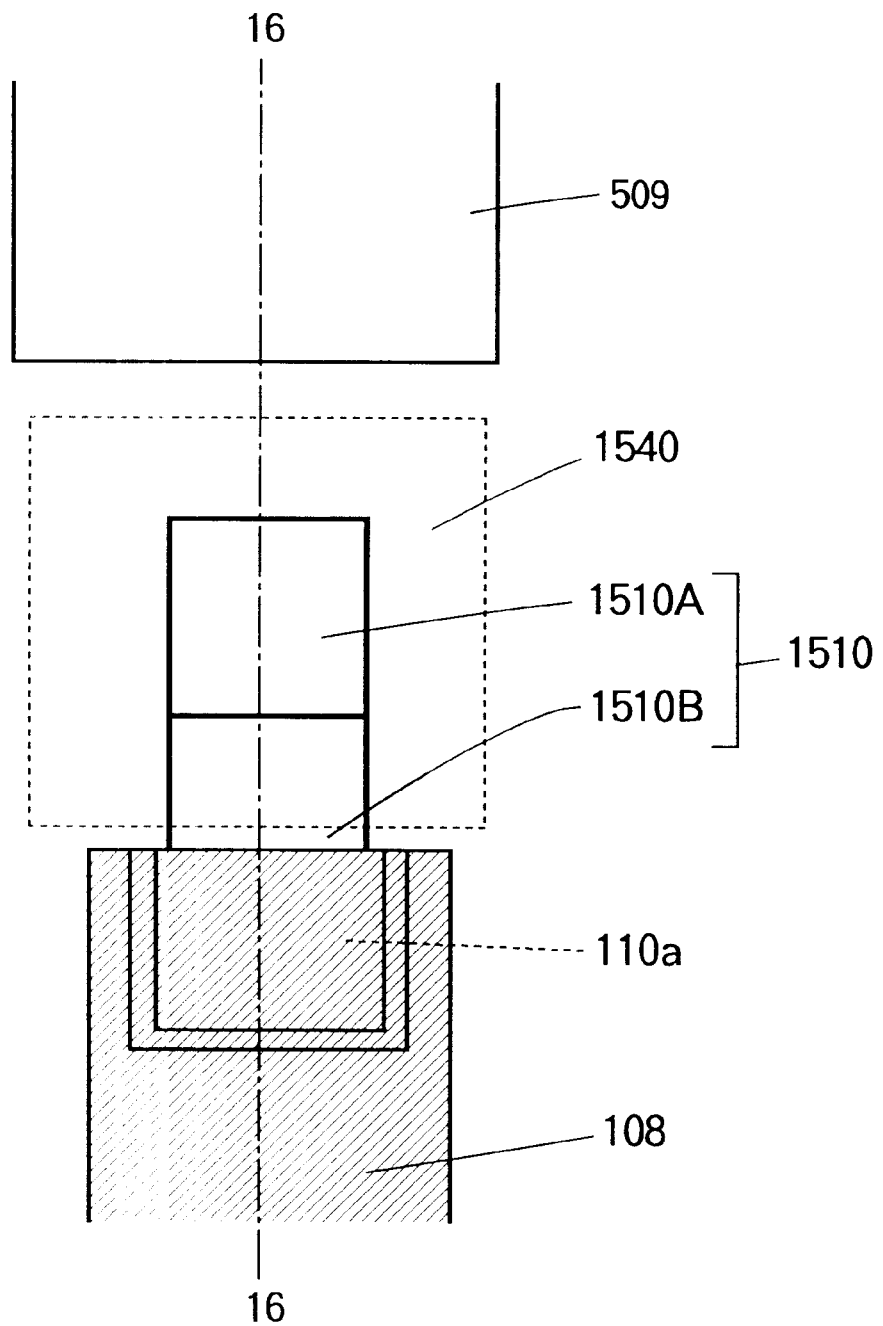

Referring to FIG. 20, the fifth embodiment can also be modified so that the first diffusion area 1510A and the part of the second diffusion area 1510B disposed in the unobstructed light-emitting area 1540 are more narrow than the part of the second diffusion area 1510B disposed beneath the p-electrode 108. This modification of the shape of the p-type diffusion area 1510 enables the contact area between the p-electrode 108 and the second diffusion area 1510B to be increased. The sectional structure through line 16—16 (shown in FIG. 16) remains unchanged.

Next, a sixth embodiment will be described. In the sixth embodiment, the p-electrode completely surrounds the p-type diffusion area.

Figure 21:
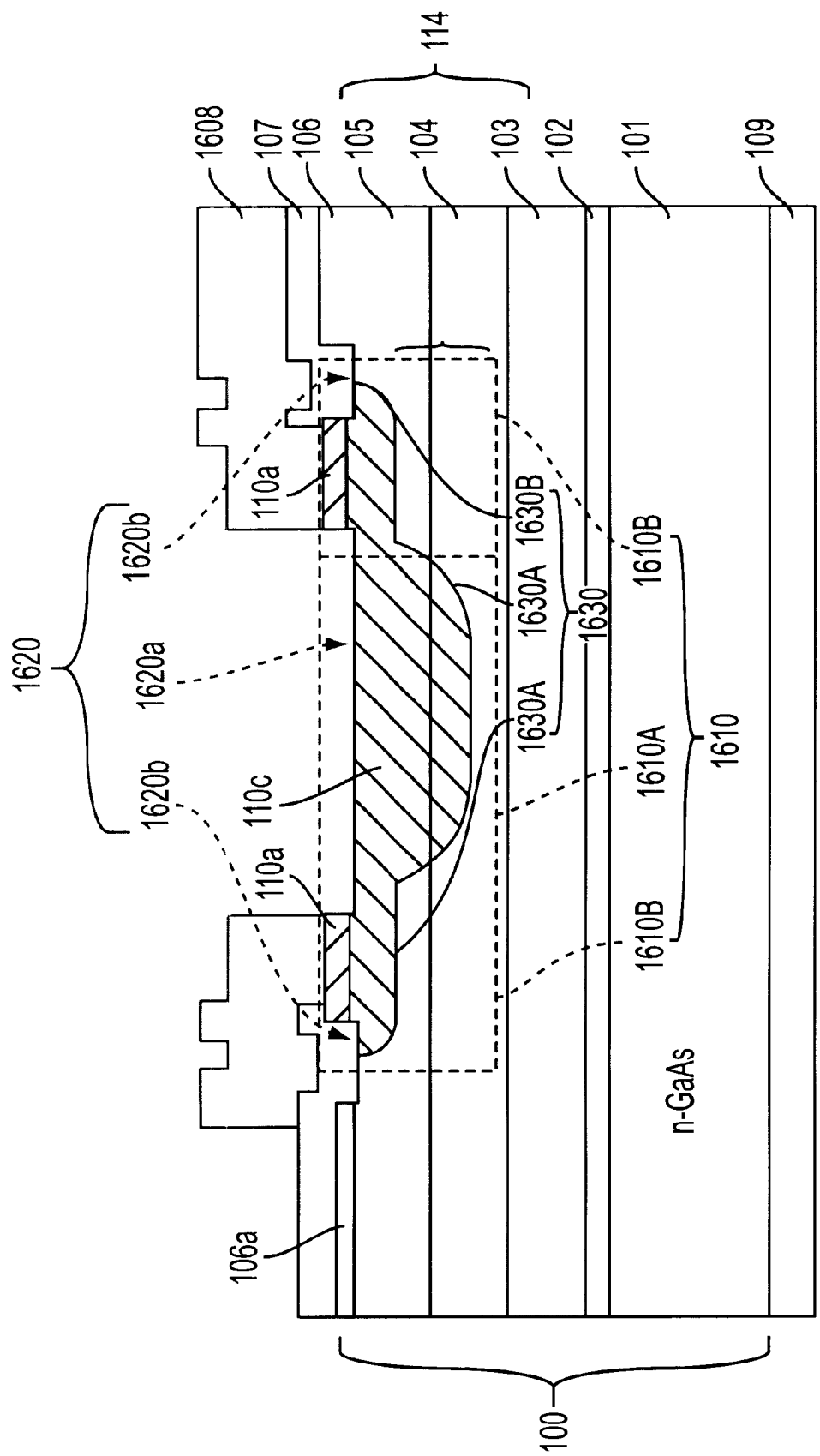
FIG. 21 is a sectional view of a sixth embodiment, illustrating the first aspect of the invention.

Referring to FIG. 21, the sixth embodiment uses the semiconductor substrate 100 described in the first embodiment. A p-type diffusion area 1610 comprising a first diffusion area 1610A and a more shallow second diffusion area 1610B surrounding the first diffusion area 1610A is formed by diffusion of a zinc impurity into the substrate 100, the diffusion proceeding through the semi-insulating GaAs contact layer 106 into the $Al_xGa_{1-x}As$ layer 105 in the second diffusion area 1610B, and also into the $Al_yGa_{1-y}As$ layer 104 in the first diffusion area 1610A. After the diffusion, part of the GaAs contact layer 106, and part of the $Al_xGa_{1-x}As$ layer 105 disposed at the interface between the GaAs contact layer 106 and the $Al_xGa_{1-x}As$ layer 105, are etched to form an etched zone 1620. The etched zone 1620 comprises two separate parts: a first etched zone 1620a including all portions of the GaAs contact layer 106 and underlying interface material disposed in the first diffusion area 1610A, and a second etched zone 1620b including all parts of the diffusion front 1630 that are disposed in the GaAs contact layer 106 and underlying interface. A square annular p-type GaAs region 110a is left between the first etched zone 1620a and the second etched zone 1620b.

The diffusion front 1630 is stepped, comprising a first diffusion front 1630A disposed in the first diffusion area 1610A, and a more shallow second diffusion front 1630B disposed in the second diffusion area 1610B.

After the formation of the etched zone 1620, an inter-layer insulating film 107 is deposited and patterned so that the second etched zone 1620b is completely covered, and the first etched zone 1620a is completely exposed. The surface of the first diffusion area 1610A is thus left completely exposed. Part of the surface of the second diffusion area 1610B disposed around the rim of the first diffusion area 1610A is also left exposed. A p-electrode 1608 comprising aluminum, for example, is then deposited and patterned so as to make contact with the p-type GaAs region 110a in the second diffusion area 1610B, while leaving the first diffusion area 1620A and first etched zone 1620a completely exposed. An n-electrode 109 is formed on the underside of the semiconductor substrate 100 as in the first embodiment. FIG. 22 is a plan view of the sixth embodiment, showing that the first diffusion area 1610A is completely surrounded by the second diffusion area 1610B, the p-type GaAs region 110a, and the p-electrode 1608. FIG. 21 is a section through line 21—21 in FIG. 22.

The sixth embodiment operates in the same way as the first embodiment, light generated by carrier recombination in the p-type $Al_yGa_{1-y}As$ region 110c and n-type $Al_yGa_{1-y}$ As layer 104 being transmitted through the p-type $Al_xGa_{1-x}$As region 110b and n-type $Al_xGa_{1-x}$As layer 105 without being absorbed, and emitted through the first etched zone 1620a, in which none of the absorbing GaAs contact layer 106 is left. Current flows from the second diffusion area 1610B into the first diffusion area 1610A without crossing the pn junction in the second diffusion area 1610B, because of the higher bandgap energy of the $Al_xGa_{1-x}$As layer 105. Since the second diffusion area 1610B completely surrounds the first diffusion area 1610A, current flows into the first diffusion area 1610A from all directions, creating a more uniform current pattern in the first diffusion area 1610A than in the first embodiment, thus further enhancing the light-emitting efficiency of the device.

The variations described in the first embodiment also apply to the sixth embodiment. The first etched zone 1620a can be eliminated, the p-type GaAs region 110a being left in the first diffusion area 1610A, provided the GaAs contact layer 106 is thin enough (e.g., 500 Å or less) not to cause significant absorption. It is desirable to remove the part of the second diffusion front 1630B disposed in the GaAs contact layer 106, but this is not strictly necessary; the second etched zone 1620b can also be eliminated.

The semi-insulating GaAs contact layer 106 can be replaced with an n-type GaAs contact layer, or the GaAs contact layer 106 can simply be omitted, provided the aluminum composition ratio x of the $Al_xGa_{1-x}$As layer 105 is 0.2 or less, so that an ohmic contact can be formed with the p-electrode 1608.

Next, a seventh embodiment will be described. The seventh embodiment combines the features of the third and sixth embodiments.

Figure 23:
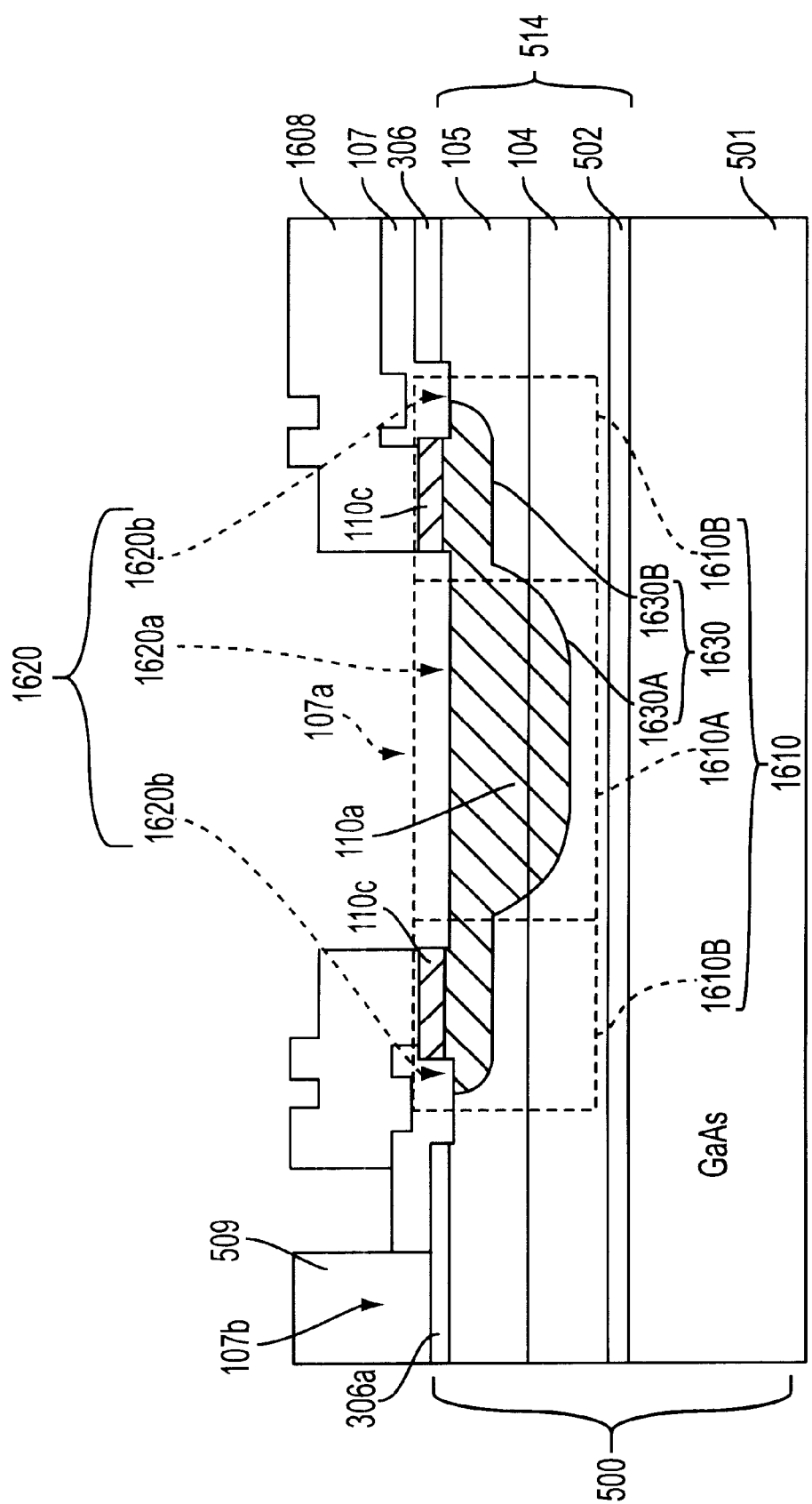
FIG. 23 is a sectional view of a seventh embodiment, illustrating the first aspect of the invention.

Referring to FIG. 23, the seventh embodiment has the semiconductor substrate 500 and n-electrode 509 described in the third embodiment. A p-type diffusion area 1610 comprising a first diffusion area 1610A and a surrounding second diffusion area 1610B is formed as in the sixth embodiment, with a similar diffusion front 1630 comprising a first part 1630A and second part 1630B. An etched zone 1620 comprising a first etched zone 1620a and second etched zone 1620b is formed as in the sixth embodiment, after which an inter-layer insulating film 107 and p-electrode 1608 are deposited and patterned as in the sixth embodiment. An opening 107b is left in the inter-layer insulating film 107 for the n-electrode 509, as in the third embodiment, in addition to the opening 107a that exposes the surface of the p-type diffusion area 1610.

Figure 24:
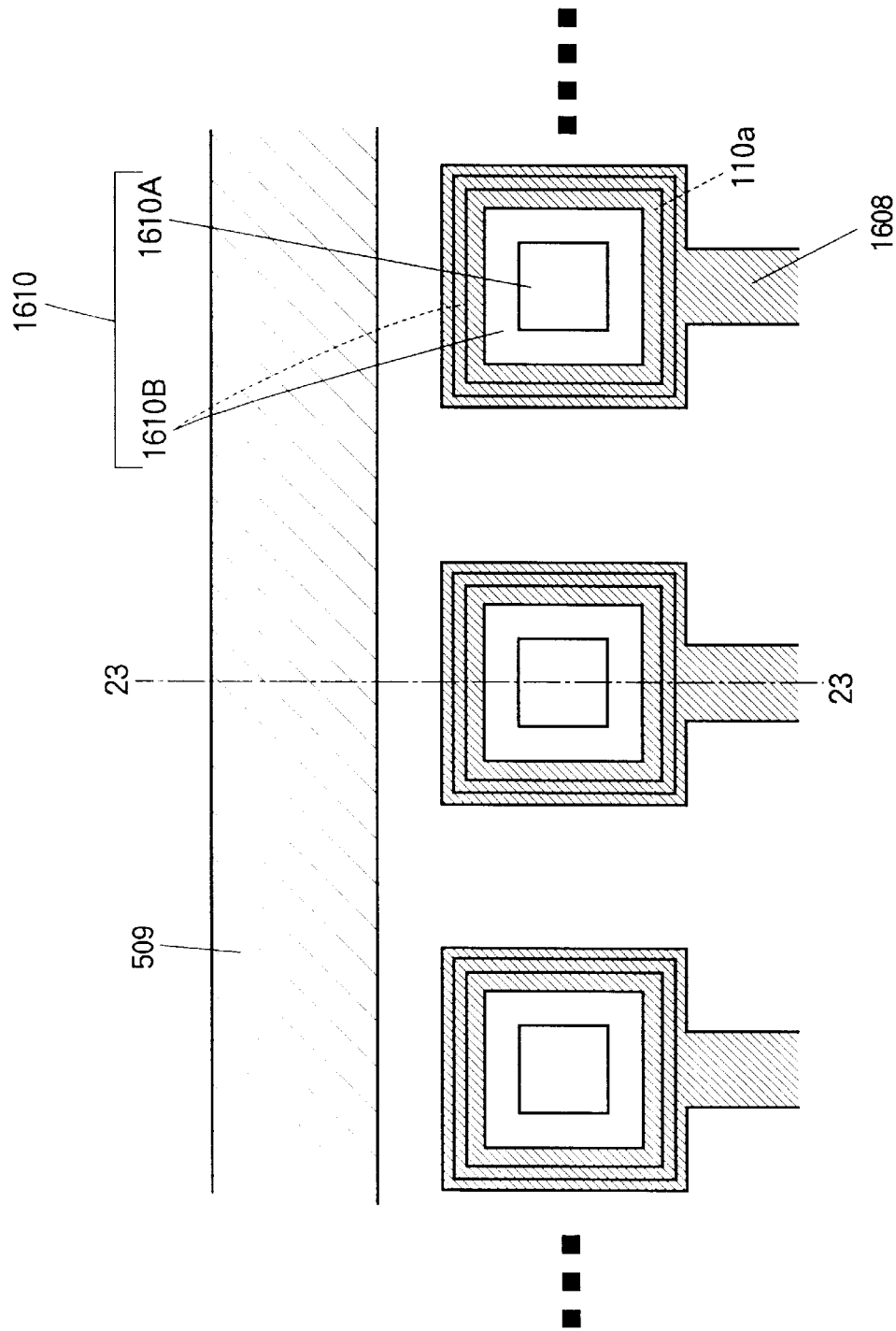
FIG. 24 is a plan view of the seventh embodiment.

FIG. 24 is a plan view of the seventh embodiment, showing the two parts of the p-type diffusion area 1610, the p-type GaAs region 110a, the p-electrode 1608, and the n-electrode 509. FIG. 23 is a section through line 23—23 in FIG. 24.

The seventh embodiment operates as described in the third embodiment, but provides a more uniform current flow in the first diffusion area 1610A, since current flows in from the second diffusion area 1610B on all sides. Light is accordingly emitted with a higher intensity.

In a variation of the seventh embodiment, the first etched zone 1620a is eliminated, leaving the p-type GaAs region 110a present in the first diffusion area 1610A, provided the GaAs contact layer 306 is thin enough (e.g., 500 Å or less) not to cause significant light absorption.

In another variation, the etched zone 1620 terminates at the interface between the GaAs contact layer 306 and the $Al_xGa_{1-x}$As layer 105, without removing any of the material of the $Al_xGa_{1-x}$As layer 105 in the interface region.

In another variation, a lower cladding layer is provided, as described in the third embodiment and illustrated in FIGS. 10, 11, or 12, for example.

In another variation, the GaAs contact layer 306 is eliminated, and the aluminum composition ratio x of the $Al_yGa_{1-y}$As layer 104 is limited to 0.2 or less, permitting an ohmic contact to be formed directly between the $Al_xGa_{1-x}$As layer 105 and p-electrode 1608. Alternatively, the n-type GaAs contact layer 306 is replaced by a semi-insulating GaAs contact layer 106, as illustrated in FIG. 13.

The location of the n-electrode 509 may also be altered, as mentioned in the third embodiment, to reduce the chip size or simplify wire bonding, for example.

Next, an eighth embodiment will be described. The eighth embodiment combines the features of the fifth and sixth embodiments.

Figure 25:
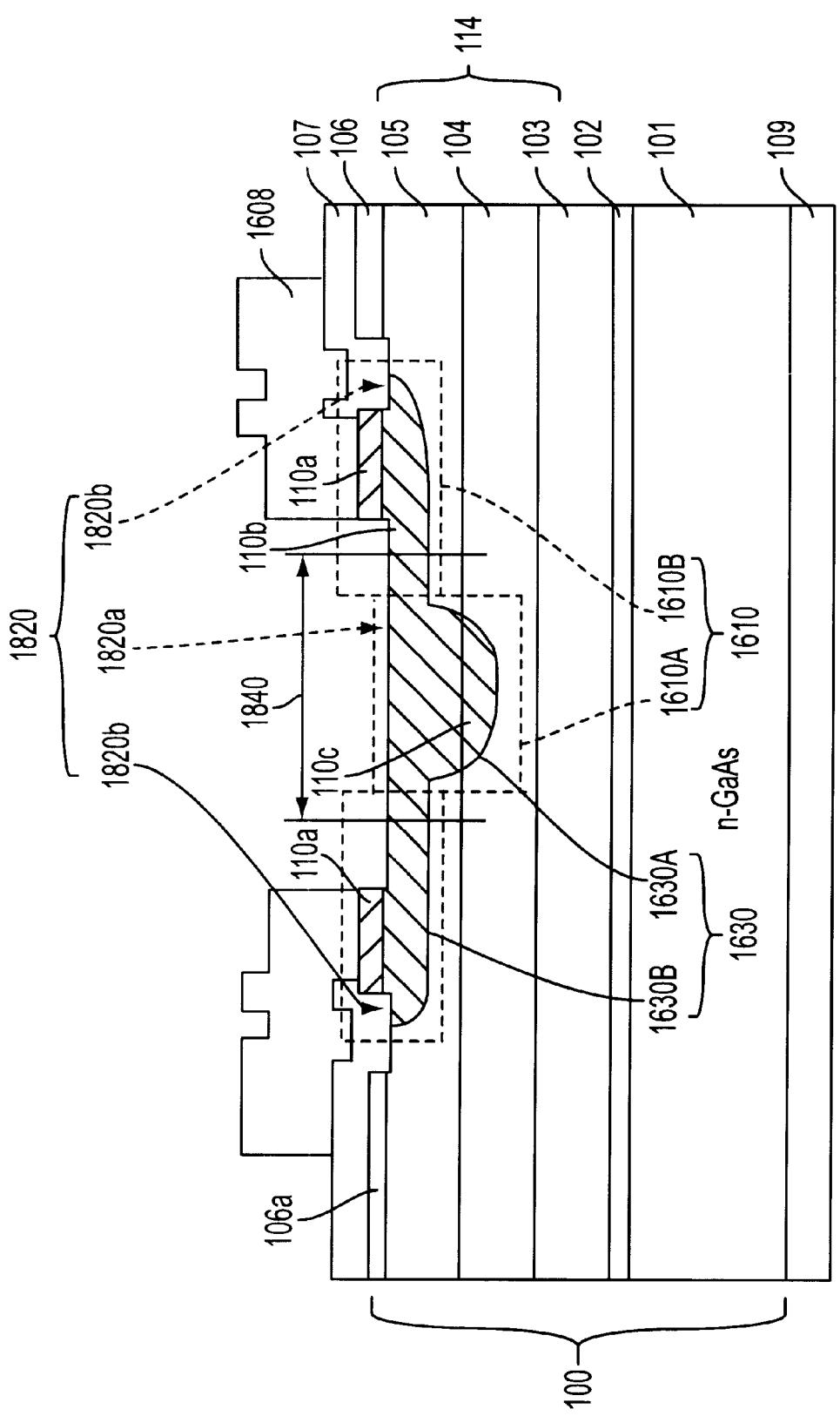
FIG. 25 is a sectional view of an eighth embodiment, illustrating the first aspect of the invention.

Referring to FIG. 25, the eighth embodiment has the semiconductor substrate 100 described in the first embodiment. A p-type diffusion area 1610 comprising a first diffusion area 1610A surrounded by a second diffusion area 1610B is formed substantially as in the sixth embodiment, but the relative sizes of the first and second diffusion areas are altered, by enlarging the second diffusion area 1610B, for example, or by reducing the size of the first diffusion area 1610A, as shown. The diffusion front 1630 is stepped as in the sixth embodiment. The first diffusion front 1630A of the first diffusion area 1610A extends into the $Al_yGa_{1-y}$As layer 104, while the second diffusion front 1630B of the second diffusion area 1610B terminates in the $Al_xGa_{1-x}$As layer 105.

After the diffusion, an etched zone 1820 comprising a first etched zone 1820a and a second etched zone 1820b is formed. The first etched zone 1820a includes the GaAs contact layer 106, and the underlying interface between the GaAs contact layer 106 and the $Al_xGa_{1-x}$As layer 105, in the first diffusion area 1610A and the inner part of the second diffusion area 1610B. The second etched zone 1820b includes parts of the GaAs contact layer 106 and the underlying interface in which the second diffusion front 1630B is disposed. An inter-layer insulating film 107 and p-electrode 1608 are then deposited and patterned as in the sixth embodiment.

Figure 26:
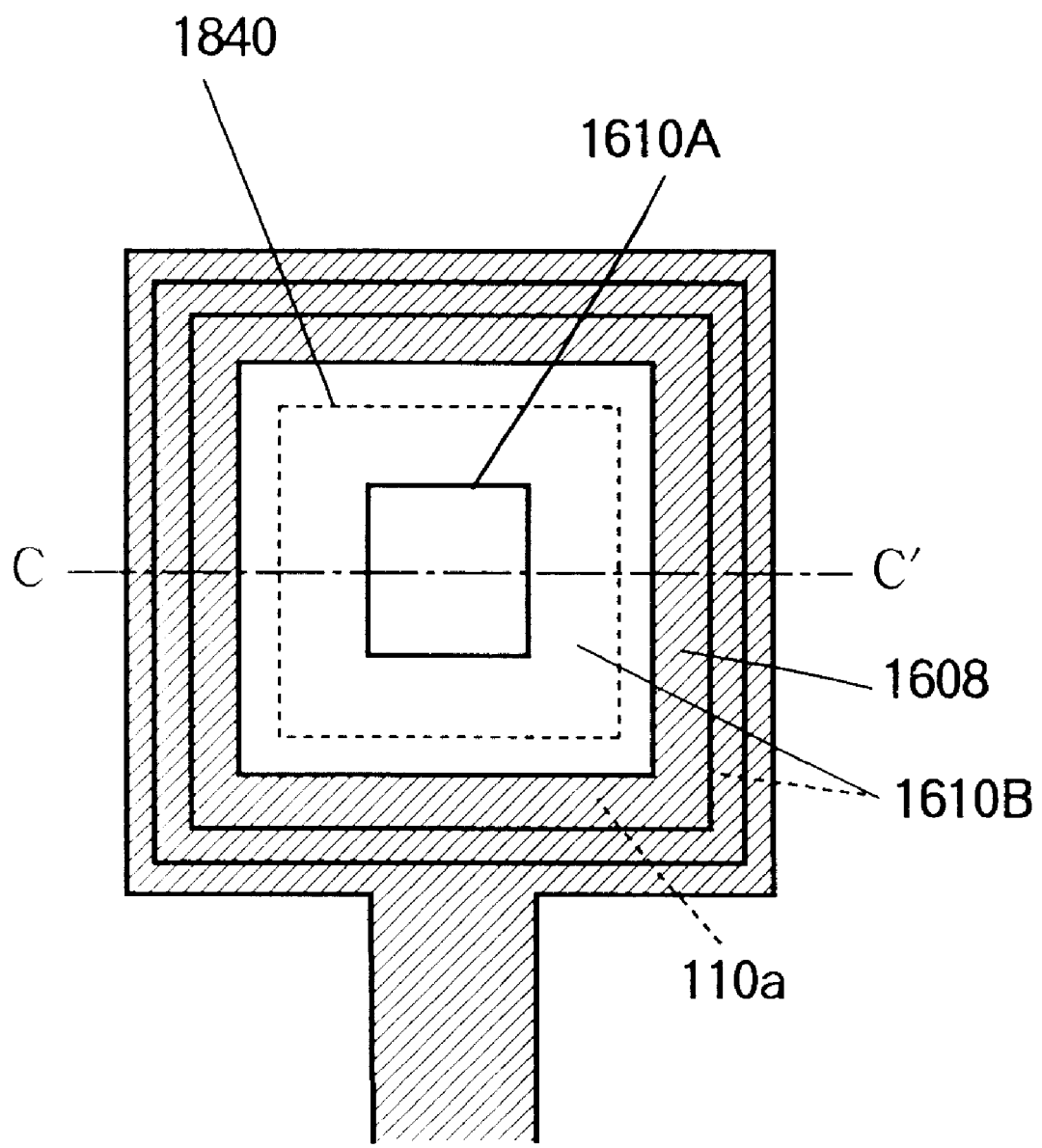
FIG. 26 is a plan view illustrating the eighth embodiment.

The light-emitting area 1840 in the eighth embodiment includes the surface area of the first diffusion area 1610A and part of the surrounding surface of the second diffusion area 1610B, as shown by the plan view in FIG. 26.

The eighth embodiment operates as described in the sixth embodiment, but light generated by carrier recombination in the p-type $Al_yGa_{1-y}$As region 110c in the first diffusion area 1610A and emitted through the light-emitting area 1840 is not reflected by the surrounding p-electrode 1608, even if the light is emitted at an oblique angle. Compared with the sixth embodiment, therefore, a greater proportion of the light is emitted to the outside, making the eighth embodiment more efficient than the sixth embodiment.

In a variation of the eighth embodiment, the first etched zone 1820a is eliminated, leaving the p-type GaAs region 110a present in the first diffusion area 1610A, provided the GaAs contact layer 106 is thin enough (e.g., 500 Å or less) not to cause significant light absorption.

In another variation, the etched zone 1620 terminates at the interface between the GaAs contact layer 106 and the $Al_xGa_{1-x}$As layer 105, without removing any of the material of the $Al_xGa_{1-x}$As layer 105 in the interface region.

In another variation, the semi-insulating GaAs contact layer 106 is replaced by an n-type GaAs contact layer having a p-type GaAs region that forms an ohmic contact with the p-electrode 1608, as in the seventh embodiment.

In another variation, the n-electrode is disposed on the same surface as the p-electrode 1608, as in the seventh embodiment, instead of being disposed on the opposite side of the device.

The common feature retained in these variations is that the first diffusion area 1610A is disposed within a significantly larger light-emitting area 1840, and the p-electrode 1608 is disposed outside the light-emitting area 1840, so that light emitted through the light-emitting area 1840 is not reflected by the p-electrode 1608.

In another variation, the GaAs contact layer 106 is eliminated, and the aluminum composition ratio x of the $Al_yGa_{1-y}As$ layer 104 is limited to 0.2 or less, permitting an ohmic contact to be formed directly between the $Al_xGa_{1-x}As$ layer 105 and p-electrode 1608.

Next, a ninth embodiment will be described.

Figure 27:
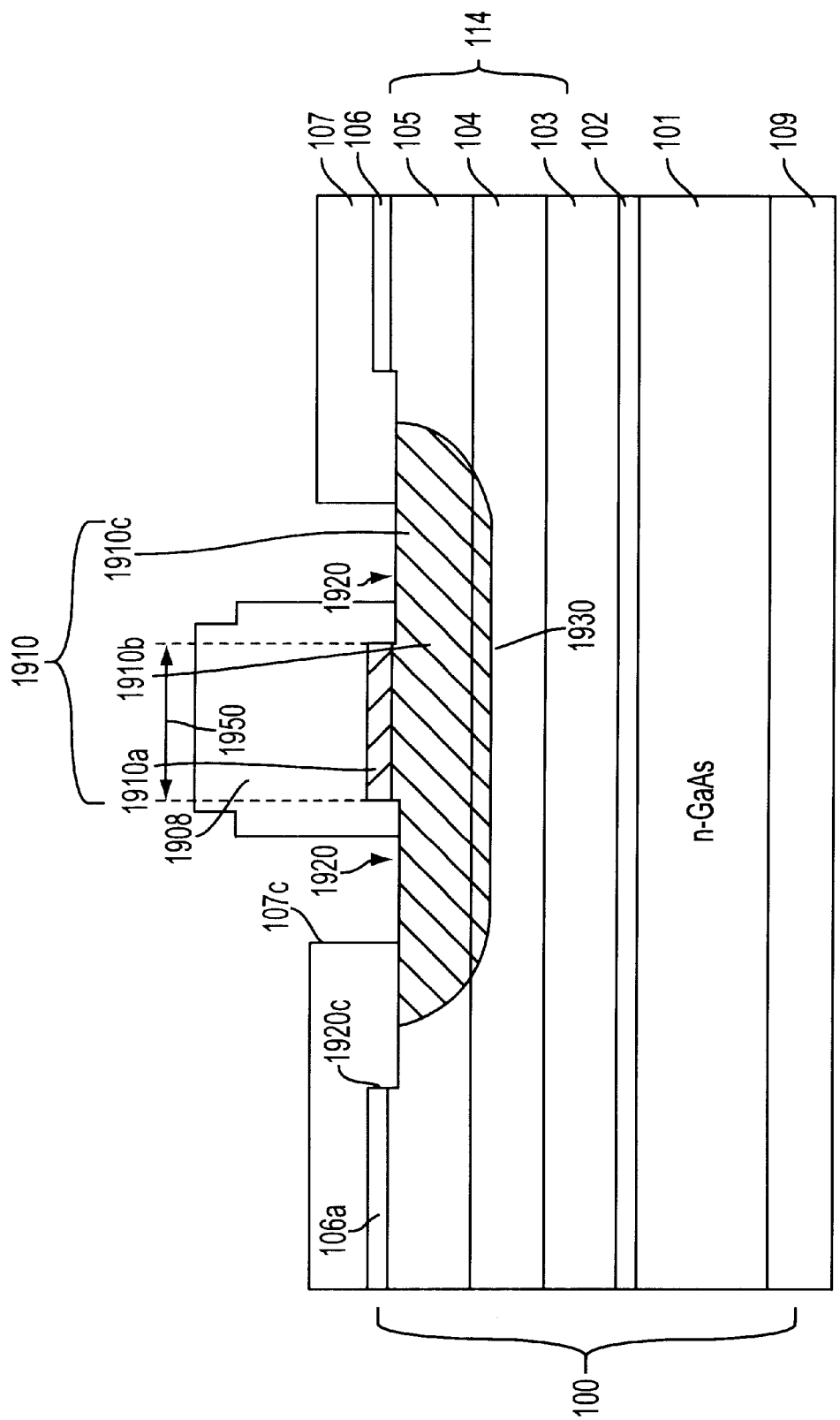
FIG. 27 is a sectional view of a ninth embodiment, illustrating the second aspect of the invention.

Referring to FIG. 27, the ninth embodiment comprises the semiconductor substrate 100 described in the first embodiment, an inter-layer insulating film 107 formed on the upper surface of the semiconductor substrate 100, an n-electrode 109 formed on the lower surface of the substrate, a p-electrode 1908, a p-type diffusion area 1910, and an etched zone 1920.

The p-type diffusion area 1910 is formed by diffusing a zinc impurity into the semiconductor substrate 100. The diffusion front 1930 differs from the diffusion fronts in the previous embodiments in not being stepped; diffusion proceeds uniformly into the $Al_yGa_{1-y}As$ layer 104. The p-type diffusion area 1910 includes a p-type GaAs region 1910a, a p-type $Al_xGa_{1-x}As$ region 1910b, and a p-type $Al_yGa_{1-y}As$ region 1910c. A pn junction is formed at the diffusion front 1930 in the $Al_yGa_{1-y}As$ layer 104 and the $Al_xGa_{1-x}As$ layer 105, but not in the GaAs contact layer 106.

After the diffusion that creates the p-type diffusion 1910, the etched zone 1920 is formed, in which all of the p-type GaAs region 1910a is removed except for a central rectangular portion left to create an electrode contact area 1950 below the intended position of the p-electrode 1908.

The part of the p-type GaAs region 1910a including the diffusion front 1930 is entirely removed. The etched zone 1920 is deep enough to remove the part of the diffusion front 1930 disposed in the interface between the GaAs contact layer 106 and the $Al_xGa_{1-x}As$ layer 105 as well. The edge 1920c of the etched zone 1920 is disposed outside the diffusion front 1930, so that the etched zone 1920 has a larger surface area than the p-type diffusion area 1910. As a result of the formation of the etched zone 1920, the remaining p-type GaAs region 1910a is isolated by a wide gap from the remaining semi-insulating GaAs contact layer 106a; the surface of the p-type $Al_xGa_{1-x}As$ region 1910b is exposed in the entire p-type diffusion area 1910, except for the electrode contact area 1950, and a pn junction is left only in the $Al_yGa_{1-y}As$ layer 104 and $Al_xGa_{1-x}As$ layer 105.

Next, the inter-layer insulating film 107 is deposited and patterned. The edge 107c of the inter-layer insulating film 107 is disposed inside the perimeter of the p-type diffusion area 1910. The inter-layer insulating film 107 covers all exposed n-type portions of the $Al_xGa_{1-x}As$ layer 105.

Figure 28:
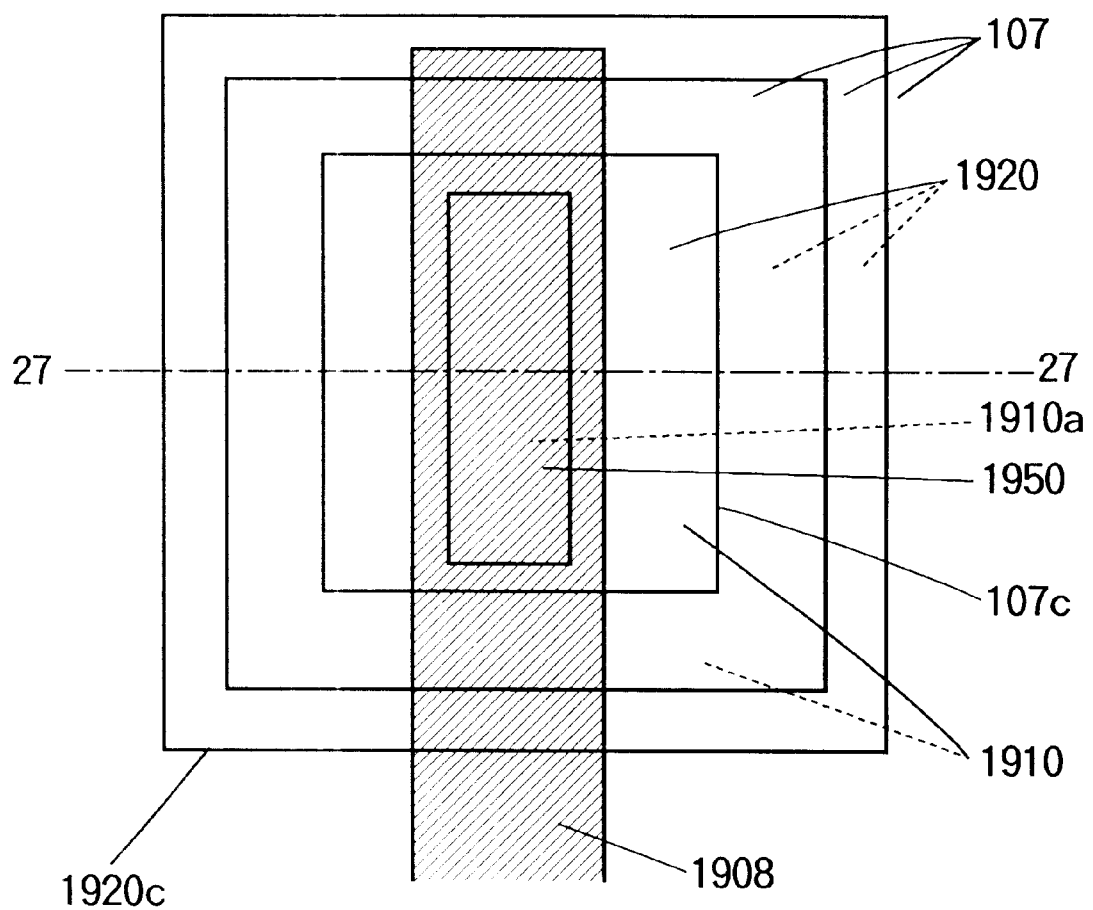
FIG. 28 is a plan view illustrating the ninth embodiment.

Referring to the plan view in FIG. 28, a film of aluminum, for example, is deposited and patterned to form a p-electrode 1908 extending completely across the p-type diffusion area 1910, completely covering the electrode contact area 1950, and forming an ohmic contact with the p-type GaAs region 1910a in the electrode contact area 1950. The p-electrode 1908 also makes contact with a small part of the exposed p-type $Al_xGa_{1-x}As$ region 1910b, but the inter-layer insulating film 107 prevents contact between the p-electrode 1908 and the n-type $Al_xGa_{1-x}As$ layer 105, thus preventing the formation of a short circuit between the p-electrode 1908 and the n-type AlGaAs layers 114. FIG. 27 is a section through line 27—27 in FIG. 28.

The ninth embodiment operates substantially as described in the first embodiment, forward current flowing from the p-electrode 1908 through the p-type diffusion area 1910 to the pn junction in the $Al_yGa_{1-y}As$ layer 104. Light generated by carrier recombination near this pn junction is not absorbed by the $Al_xGa_{1-x}As$ layer 105. Light is emitted through the exposed surface of the p-type $Al_xGa_{1-x}As$ region 110b and through the surrounding surface of the $Al_xGa_{1-x}As$ layer 105, primarily within the etched zone 1920. The p-type GaAs region 1910a and semi-insulating GaAs contact layer 106 have been removed from these areas, and the inter-layer insulating film 107 is transparent, so the light is not absorbed.

In the ninth embodiment, compared with conventional LEDs, the light emission efficiency is improved by the removal of the absorbing GaAs contact layer 106 from the light-emitting area, by the removal of the part of the pn junction disposed near the surface of the device, and by the presence of cladding layers 103 and 105 that confine injected minority carriers to the light-emitting $Al_yGa_{1-y}As$ layer 104. The last two factors raise the probability of radiative recombination by causing carrier recombination to take place in parts of the AlGaAs layers 114 that are deep enough to be substantially free of crystal lattice defects.

In a variation of the ninth embodiment, the etching process that forms the etched zone 1920 is terminated at the interface between the GaAs contact layer 106 and $Al_xGa_{1-x}As$ layer 105, so that the GaAs contact layer 106 is removed in the etched zone 1920, but the $Al_xGa_{1-x}As$ layer 105 is not removed.

In another variation, the semi-insulating GaAs contact layer 106 is replaced by an n-type GaAs contact layer.

In another variation, the n-electrode is disposed on the same surface of the semiconductor substrate 100 as the p-electrode, instead of being disposed on the opposite surface.

Next, a tenth embodiment will be described. The tenth embodiment is generally similar to the ninth embodiment, the p-electrode 1908 crossing the p-type diffusion area 1910 as shown in FIG. 28.

Figure 29:
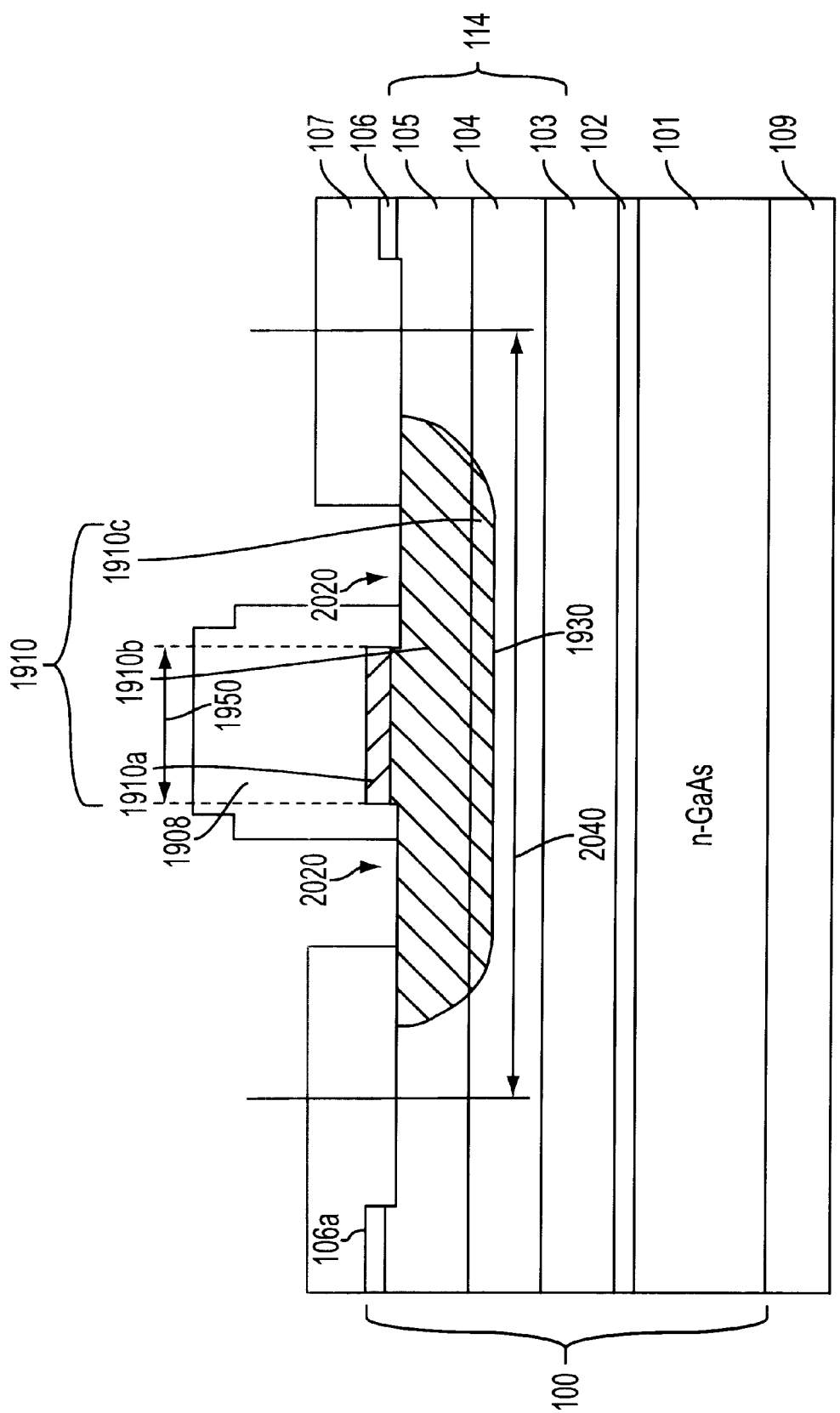
FIG. 29 is a sectional view of a tenth embodiment, illustrating the second aspect of the invention.

FIG. 29 is a sectional view of the tenth embodiment. The tenth embodiment differs from the ninth embodiment in having a wider etched zone 2020 and thus a widened light-emitting area 2040. The semiconductor substrate 100, inter-layer insulating film 107, and p-type diffusion area 1910 in the tenth embodiment have the same structure as in the ninth embodiment.

Figure 30:
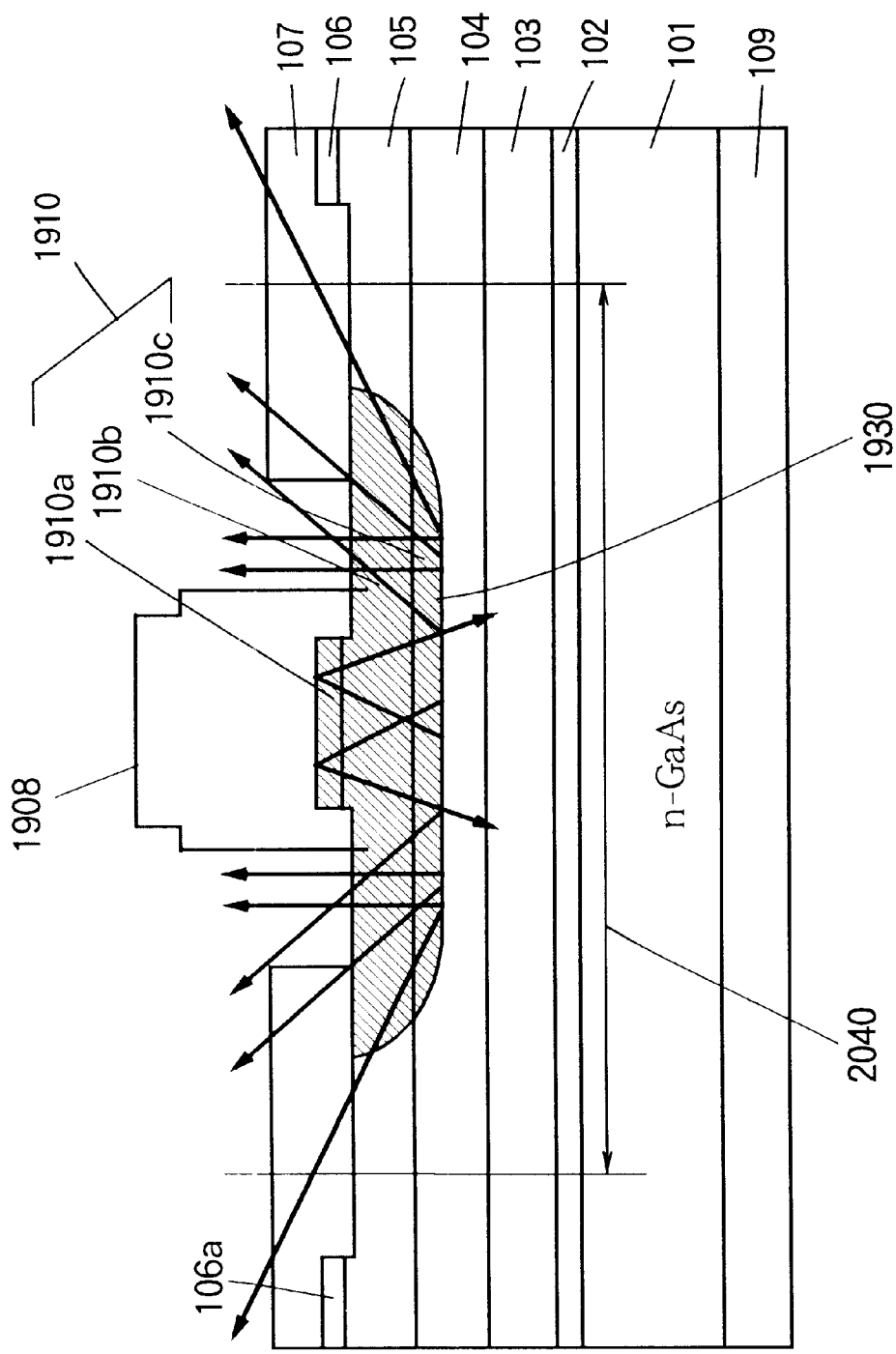
FIG. 30 is a sectional view illustrating the operation of the tenth embodiment.

Referring to FIG. 30, light emitted upward at oblique angles in the $Al_yGa_{1-y}As$ layer 104 and emerging from the surface of the $Al_xGa_{1-x}As$ layer 105 within the light-emitting area 2040 is emitted without absorption by the GaAs contact layer 106. The surface area of the light-emitting area 2040 is larger than the surface area of the p-type diffusion area 1910; the extra surface area compensates for the reflection of light by the p-electrode 1908.

The variations described in the ninth embodiment also apply to the tenth embodiment. The etching process that forms the etched zone 2020 may be stopped at the interface between the GaAs contact layer 106 and the $Al_xGa_{1-x}As$ layer 105, and the semi-insulating GaAs contact layer 106 may be replaced by an n-type GaAs contact layer.

Next, an eleventh embodiment will be described. The eleventh embodiment combines the features of the third and tenth embodiments.

Figure 31:
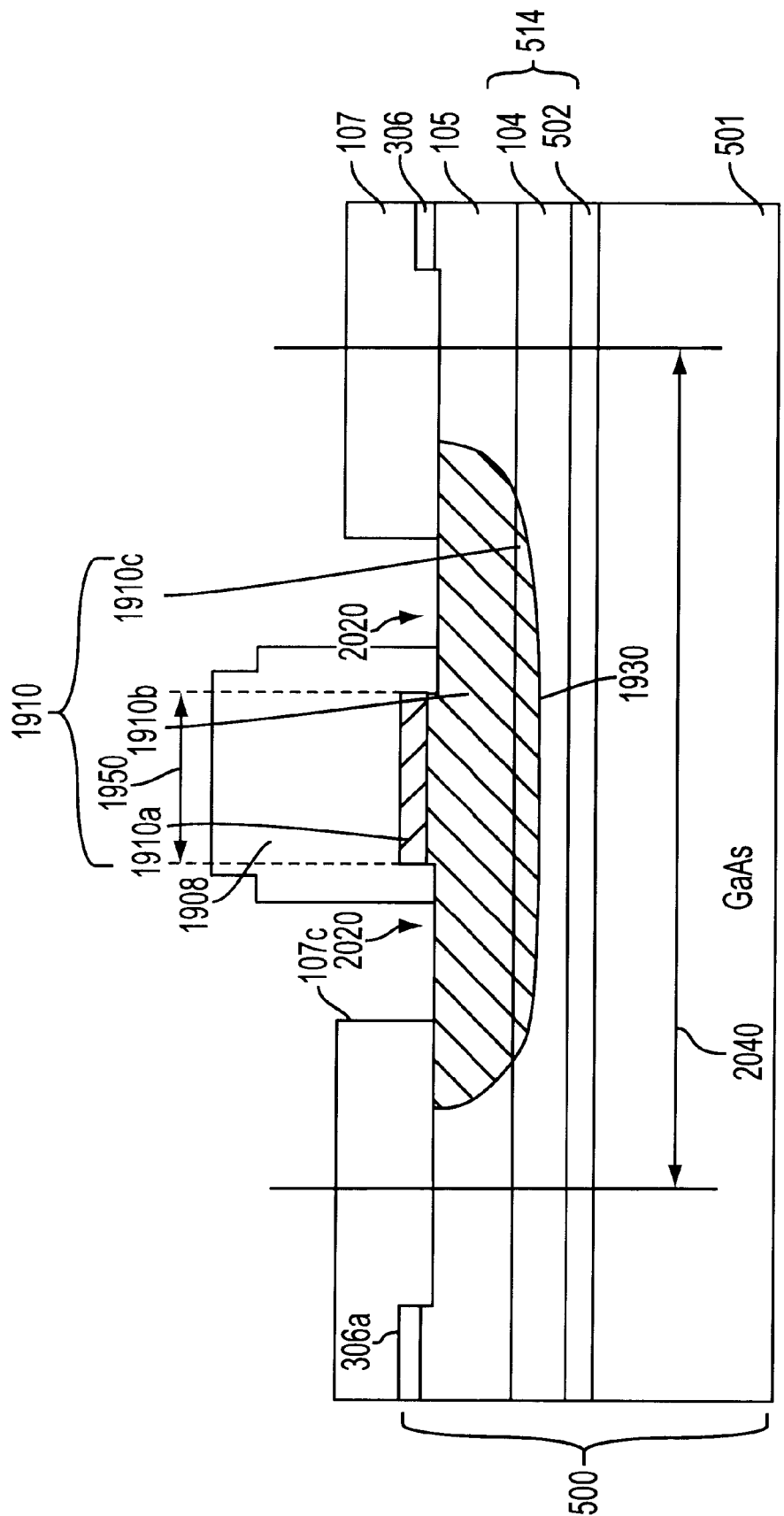
FIG. 31 sectional view of an eleventh embodiment, illustrating the second aspect of the invention.
Figure 32:
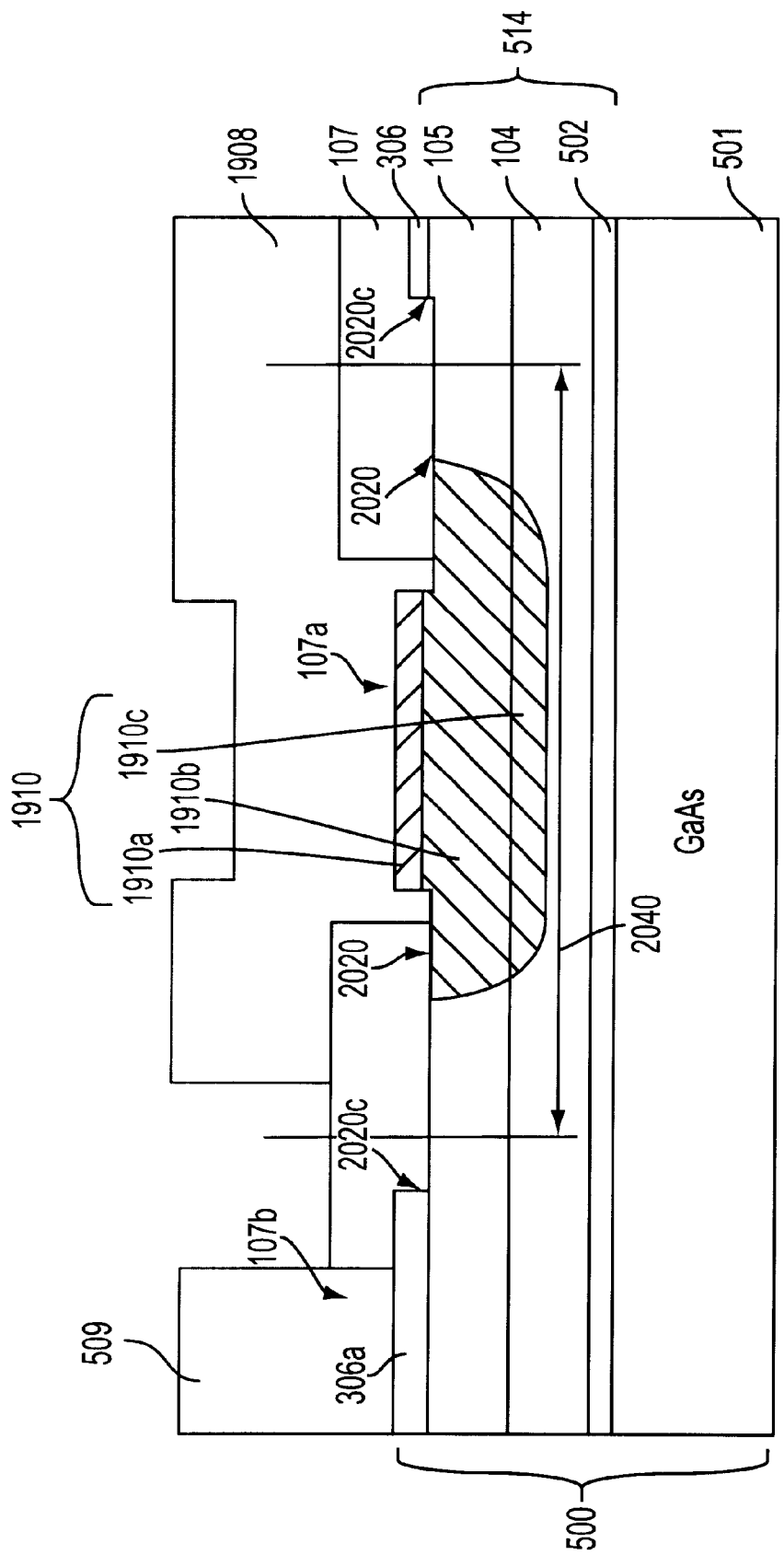
FIG. 32 is another sectional view of the eleventh embodiment.
Figure 33:
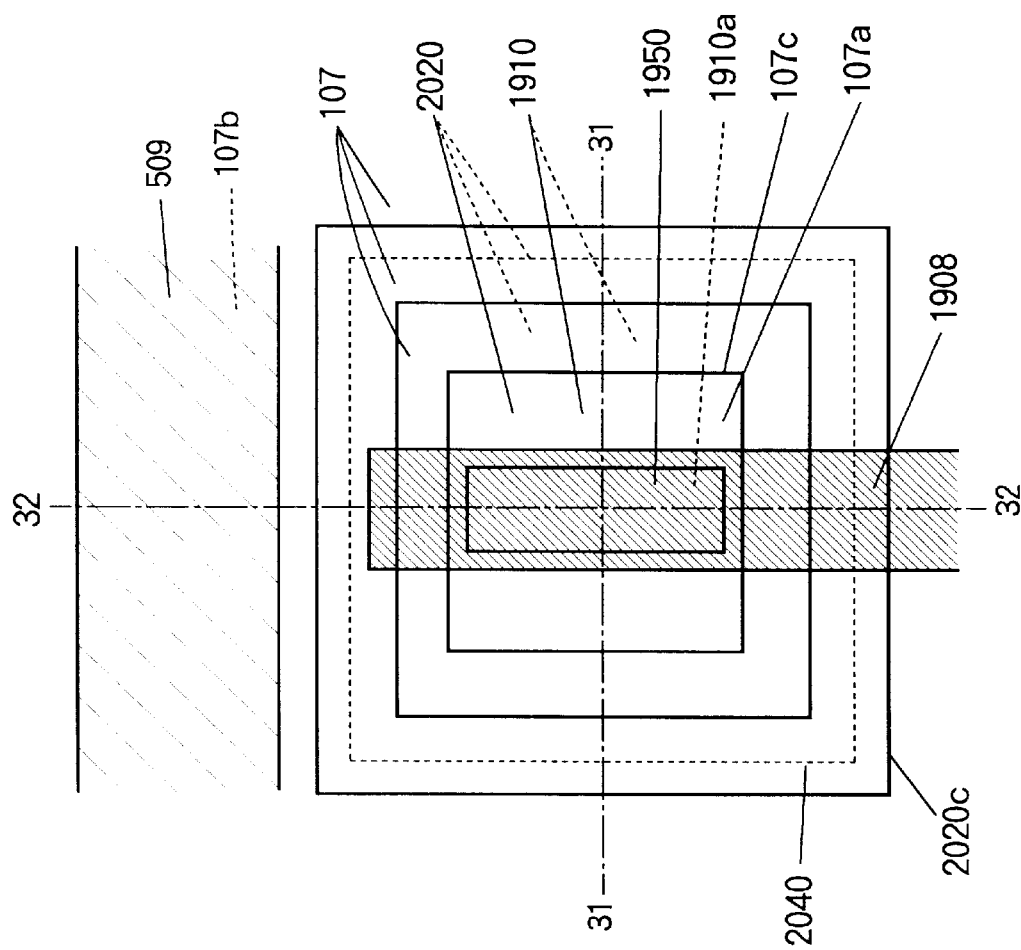
FIG. 33 is a plan view illustrating the eleventh embodiment.
Figure 34:
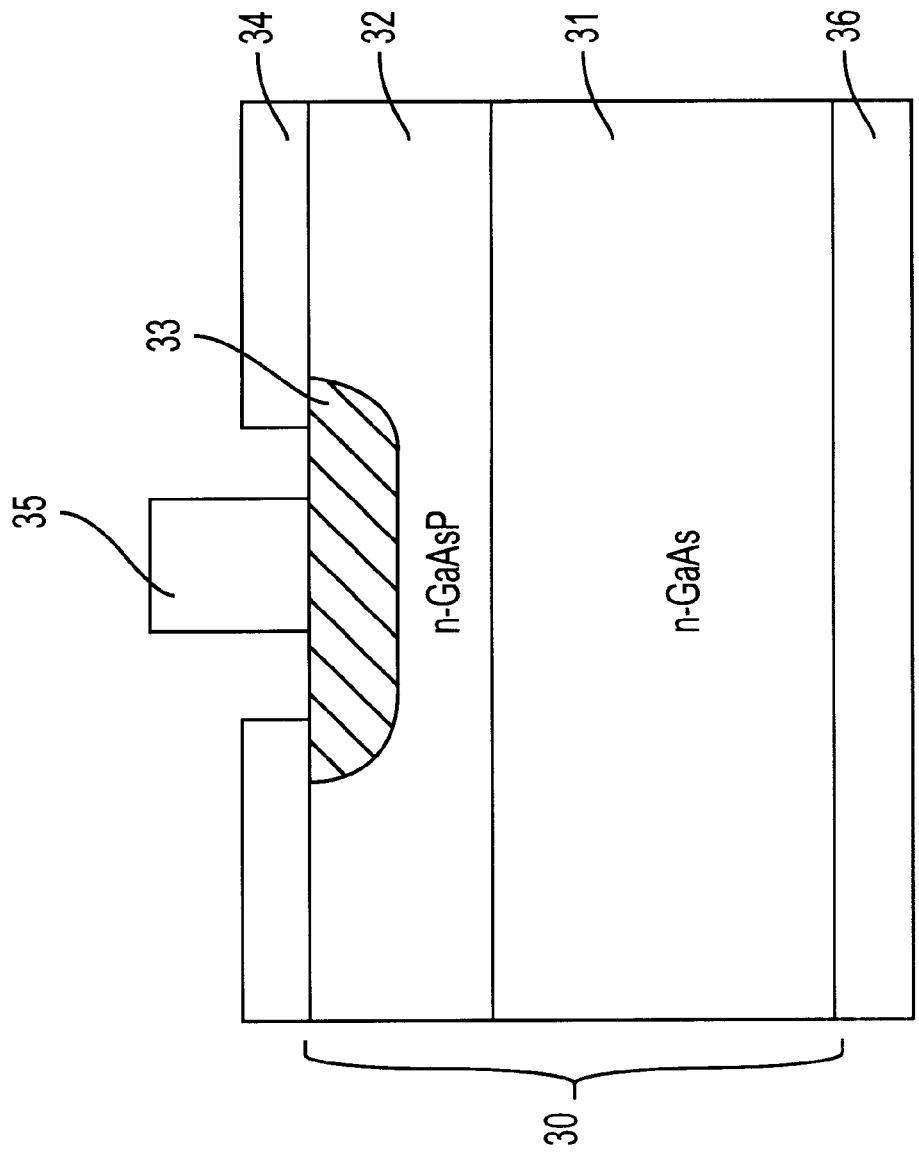
FIG. 34 is a sectional view of a conventional LED.

Referring to FIG. 31, the eleventh embodiment employs the semiconductor substrate 500 and inter-layer insulating film 107 described in the third embodiment, but has a p-type diffusion area 1910, etched zone 2020, and p-electrode 1908 as described in the tenth embodiment. Referring to FIG. 32, the eleventh embodiment places the n-electrode 509 on the upper surface, making ohmic contact with the n-type GaAs contact layer 306 through an opening 107b in the inter-layer insulating film 107, as described in the third embodiment. FIG. 33 is a plan view of the eleventh embodiment, indicating the boundary 2020c of the etched zone 2020 and the enlarged light-emitting area 2040. FIG. 31 is a sectional view through line 31—31 in FIG. 33; FIG. 32 is a sectional view through line 32—32.

The eleventh embodiment combines the advantages of the third and tenth embodiments. The cost of the device is reduced by the omission of the lower cladding layer from the semiconductor substrate 500. The enlarged light-emitting area 2040 compensates for the reflection of light by the p-electrode 1908.

As in the tenth embodiment, the etching of the etched zone 2020 can be stopped at the interface between the GaAs contact layer 306 and the $Al_xGa_{1-x}As$ layer 105.

The n-type GaAs contact layer 306 can be replaced by a semi-insulating layer, provided the part making contact with the n-electrode 509 is doped with an n-type impurity, as shown in FIG. 13.

The embodiments described above employed n-type AlGaAs layers as the light-emitting layer and cladding layers, but the invention can be practiced with other n-type semiconductor materials, such as indium gallium phosphide (InGaP) and indium gallium aluminum arsenide (InGaAlAs).

The lowest substrate layer in the embodiments above was a GaAs layer, but the invention can also be practiced with a silicon substrate. In this case the n-electrode should comprise a material, such as aluminum, capable of forming an ohmic contact with an n-type silicon substrate layer.

Although the embodiments described above are LED arrays, the invention can also be practiced in a discrete LED.

Those skilled in the art will recognize that further variations are possible within the scope claimed below.

What is claimed is:

1. A light-emitting semiconductor device, comprising:
   a semiconductor substrate having an upper surface and a plurality of semiconductor layers of a first conductive type, said semiconductor layers of said first conductive type including at least a light-emitting layer having a first bandgap energy and an upper cladding layer, disposed above said light-emitting layer, having a second bandgap energy exceeding said first bandgap energy;
   a plurality of first diffusion areas formed by diffusion of an impurity of a second conductive type from said upper surface into said upper cladding layer and said light-emitting layer, the first diffusion areas being disposed in a linear array extending in a first direction;
   a corresponding plurality of second diffusion areas formed by diffusion of said impurity from said upper surface into said upper cladding layer but not into said light-emitting layer, each second diffusion area being continuous with one of said first diffusion areas, the continuity being in a second direction perpendicular to the first direction;
   a first electrode making contact with said semiconductor substrate in an area outside said first diffusion areas and said second diffusion areas; and
   a corresponding plurality of second electrodes disposed only outside of said first diffusion areas, making contact with the upper surface of said semiconductor substrate in respective second diffusion areas and thus being electrically coupled through said second diffusion areas to said first diffusion areas.

2. The light-emitting semiconductor device of claim 1, wherein said second diffusion areas are wider than said first diffusion areas.

3. The light-emitting semiconductor device of claim 1, wherein, for each said first diffusion area, said upper surface has a continuous light-emitting area larger than said first diffusion area, said first diffusion area being disposed within said light-emitting area, the second electrode electrically coupled to said first diffusion area being disposed only outside said light-emitting area.

4. The light-emitting semiconductor device of claim 3, wherein said semiconductor substrate also has a semiconductor contact layer disposed above said upper cladding layer, making ohmic contact with said second electrode in said second diffusion area, and said light-emitting area is completely exposed by complete removal of said contact layer from the light-emitting area.

5. The light-emitting semiconductor device of claim 3, wherein each said second diffusion area is wider than said first diffusion area.

6. A light-emitting semiconductor device, comprising:
   a semiconductor substrate having an upper surface and a plurality of semiconductor layers of a first conductive type, said semiconductor layers of said first conductive type including at least a light-emitting layer having a first bandgap energy and an upper cladding layer, disposed above said light-emitting layer, having a second bandgap energy exceeding said first bandgap energy;
   a first diffusion area formed by diffusion of an impurity of a second conductive type from said upper surface into said upper cladding layer and said light-emitting layer;
   a second diffusion area, continuous with said first diffusion area, formed by diffusion of said impurity from said upper surface into said upper cladding layer but not into said light-emitting layer;
   a first electrode making contact with said semiconductor substrate in an area outside of said first diffusion area and said second diffusion area; and
   a second electrode disposed only outside said first diffusion area, making contact with the upper surface of said semiconductor substrate in said second diffusion area;
   wherein said upper surface is etched in an area including a lateral diffusion front of said first diffusion area and said second diffusion area.

7. The light-emitting semiconductor device of claim 1, wherein said light-emitting layer and said upper cladding layer are layers of aluminum gallium arsenide with different aluminum composition ratios.

8. The light-emitting semiconductor device of claim 1, wherein said semiconductor substrate also has a semiconductor contact layer disposed above said upper cladding layer, making ohmic contact with said second electrodes in said second diffusion areas.

9. The light-emitting semiconductor device of claim 8, wherein said semiconductor contact layer is entirely removed from said first diffusion areas by etching.

10. The light-emitting semiconductor device of claim 8, wherein, for each said first diffusion area, said upper surface has a light-emitting area larger than said first diffusion area, said first diffusion area being disposed within said light-emitting area, and said semiconductor contact layer is entirely removed from said light-emitting area by etching.

11. The light-emitting semiconductor device of claim 8, wherein said semiconductor contact layer is removed by etching in an area including a lateral diffusion front of said first diffusion areas and said second diffusion areas.

12. The light-emitting semiconductor device of claim 11, wherein said semiconductor contact layer and said upper cladding layer have an interface that is also removed by etching in said area including said lateral diffusion front.

13. The light-emitting semiconductor device of claim 8, wherein said semiconductor contact layer is a gallium arsenide layer, and said light-emitting layer and said upper cladding layer are layers of aluminum gallium arsenide with different aluminum composition ratios.

14. The light-emitting semiconductor device of claim 1, wherein said semiconductor substrate includes a lower cladding layer, having a third bandgap energy exceeding said first bandgap energy, disposed below said light-emitting layer.

15. The light-emitting semiconductor device of claim 1, wherein said semiconductor substrate includes a semi-insulating semiconductor layer disposed below said light-emitting layer.

16. The light-emitting semiconductor device of claim 1, wherein said first electrode is disposed on the upper surface of said semiconductor substrate.

17. The light-emitting semiconductor device of claim 1, wherein said semiconductor substrate includes a lowermost semiconductor layer of said first conductive type disposed below said light-emitting layer.

18. The light-emitting semiconductor device of claim 17, wherein said first electrode makes contact with said lowermost semiconductor layer.

19. The light-emitting semiconductor device of claim 1, wherein said impurity is zinc.

20. A light-emitting semiconductor device, comprising:
a semiconductor substrate having an upper surface, a semiconductor contact layer disposed at said upper surface, and a plurality of semiconductor layers of a first conductive type disposed below said upper surface, said semiconductor layers of said first conductive type including at least a light-emitting layer having a first bandgap energy and an upper cladding layer, disposed above said light-emitting layer, having a second bandgap energy exceeding said first bandgap energy;
a diffusion area formed by diffusion of an impurity of a second conductive type from said upper surface into semiconductor contact layer, said upper cladding layer, and said light-emitting layer, said diffusion area including a contact area formed in said semiconductor contact layer, said semiconductor contact layer being removed by etching from all parts of said diffusion area exterior to said contact area;
a first electrode making contact with said semiconductor substrate in an area outside said diffusion area; and
a second electrode making ohmic contact with said contact area.

21. The light-emitting semiconductor device of claim 20, wherein said upper surface has a light-emitting area larger than said diffusion area, said diffusion area being disposed within said light-emitting area, said semiconductor contact layer being removed by etching from all of said light-emitting area except said contact area.

22. The light-emitting semiconductor device of claim 20, wherein said semiconductor contact layer is removed by etching from an area including a lateral diffusion front of said diffusion area.

23. The light-emitting semiconductor device of claim 22, wherein said semiconductor contact layer and said upper cladding layer have an interface that is also removed by etching in said area including said lateral diffusion front.

24. The light-emitting semiconductor device of claim 20, wherein said semiconductor substrate includes a lower cladding layer, having a third bandgap energy exceeding said first bandgap energy, disposed below said light-emitting layer.

25. The light-emitting semiconductor device of claim 20, wherein said semiconductor substrate includes a semi-insulating semiconductor layer disposed below said light-emitting layer.

26. The light-emitting semiconductor device of claim 20, wherein said first electrode is disposed on the upper surface of said semiconductor substrate.

27. The light-emitting semiconductor device of claim 20, wherein said semiconductor substrate includes a lowermost semiconductor layer of said first conductive type disposed below said light-emitting layer.

28. The light-emitting semiconductor device of claim 27, wherein said first electrode makes contact with said lowermost semiconductor layer.

29. The light-emitting semiconductor device of claim 20, wherein said semiconductor contact layer is a gallium-arsenide layer, and said light-emitting layer and said upper cladding layer are layers of aluminum gallium arsenide with different aluminum composition ratios.

30. The light-emitting semiconductor device of claim 20, wherein said impurity is zinc.

31. The light-emitting semiconductor device of claim 6, wherein, when said upper surface is etched in said area including a lateral diffusion front, an upper part of said upper cladding layer is etched and thereby removed.

32. The light-emitting semiconductor device of claim 9, wherein, when said semiconductor contact layer is entirely removed from said first diffusion areas by etching, an upper part of said upper cladding layer is etched and thereby removed.

* * * * *